(12) United States Patent
Chang et al.

(10) Patent No.: US 11,575,054 B2
(45) Date of Patent: Feb. 7, 2023

(54) SOLAR CELL AND SOLAR CELL PANEL INCLUDING THE SAME

(71) Applicant: LG ELECTRONICS INC., Seoul (KR)

(72) Inventors: Jae Won Chang, Seoul (KR); Hyun Jung Park, Seoul (KR)

(73) Assignee: SHANGRAO JINKO SOLAR TECHNOLOGY DEVELOPMENT CO., LTD, Jiangxi Province (CN)

( * ) Notice: Subject to any disclaimer, the term of this patent is extended or adjusted under 35 U.S.C. 154(b) by 353 days.

(21) Appl. No.: 16/736,201

(22) Filed: Jan. 7, 2020

(65) Prior Publication Data

US 2020/0220034 A1     Jul. 9, 2020

(30) Foreign Application Priority Data

Jan. 8, 2019   (KR) .......................... 10-2019-0002348

(51) Int. Cl.
*H01L 31/0224*   (2006.01)
*H01L 31/02*   (2006.01)

(52) U.S. Cl.
CPC .. *H01L 31/022441* (2013.01); *H01L 31/0201* (2013.01)

(58) Field of Classification Search
CPC ................. H01L 31/022441; H01L 31/0201
See application file for complete search history.

(56) References Cited

U.S. PATENT DOCUMENTS

| 2017/0069776 A1 | 3/2017 | Yang et al. |
| 2017/0104114 A1* | 4/2017 | Kim ................... H01L 31/0504 |

FOREIGN PATENT DOCUMENTS

| CN | 104124287 A | 10/2014 |
| EP | 2743991 A2 | 6/2014 |
| JP | 2008-235795 A | 10/2008 |
| JP | 2012-119393 A | 6/2012 |
| JP | 2012-227281 A | 11/2012 |
| JP | 2014-120775 A | 6/2014 |
| JP | 5857237 B2 | 2/2016 |
| JP | 2017-55113 A | 3/2017 |
| WO | WO 2013/183148 A1 | 12/2013 |

\* cited by examiner

*Primary Examiner* — Tae-Sik Kang
(74) *Attorney, Agent, or Firm* — Tarolli, Sundheim, Covell & Tummino LLP

(57) ABSTRACT

Discussed is a solar cell including a semiconductor substrate having an inclined part; first and second conductivity type regions formed at or on one surface of the semiconductor substrate; a first electrode connected to the first conductivity type region on the one surface of the semiconductor substrate; and a second electrode connected to the second conductivity type region on the one surface of the semiconductor substrate. At least one of the first and second electrodes includes a finger part including a plurality of inner finger parts extending in a first direction, and a plurality of outer finger parts extending in the first direction adjacent to an edge of the semiconductor substrate; and a connection part connecting at least some of the plurality of outer finger parts on one side of the semiconductor substrate adjacent to the inclined part.

10 Claims, 10 Drawing Sheets

SOLAR CELL AND SOLAR CELL PANEL INCLUDING THE SAME

CROSS-REFERENCE TO RELATED APPLICATION

This application claims priority to and the benefit of Korean Patent Application No. 10-2019-0002348 filed in the Korean Intellectual Property Office on Jan. 8, 2019, the entire contents of which are incorporated herein by reference into the present application.

BACKGROUND OF THE INVENTION

Field of the Invention

The present disclosure relate to a solar cell and a solar cell panel including the same, and more particularly to a solar cell having an improved electrode structure and a solar cell panel including the same.

Description of the Related Art

Solar cells can be manufactured by forming various layers and electrodes according to design. However, solar cell efficiency can be determined according to the design of these various layers and electrodes. In order to commercialize the solar cells, low efficiency should be overcome, and the various layers and electrodes are required to be designed to maximize the efficiency of the solar cell and the output of the solar cell panel including the same.

In a conventional solar cell, a front electrode and a back electrode are positioned on a front surface and a back surface of a semiconductor substrate, respectively, and neighboring solar cells are electrically connected using an interconnector such as a ribbon. At this time, a small number (for example, three) of ribbons are positioned based on one surface of each solar cell, and thus the carriers have a long moving distance, and light loss is generated by the front electrode. Therefore, there is a limit to improving the efficiency of the solar cell.

In this regard, it has been proposed a solar cell having a back electrode structure in which electrodes of different polarities are positioned together on the back surface of the semiconductor substrate. The solar cell having such a back electrode structure is electrically connected by a wiring member positioned in a direction intersecting the electrode. However, even with such a structure, there is a long moving distance of the carriers. For example, when an inclined part is provided near each corner of the semiconductor substrate, since the electrodes near each corner have a shorter length than those of the other part, there is a problem of a long moving path of the carriers moving along the electrode not directly connected to the wiring member.

It has been disclosed to have a trapezoidal electrode part including a pair of quadrilateral parts in a structure in which electrodes of different polarities are positioned on different surfaces as described in Japanese Patent No. 5857237.

However, the structure of the trapezoidal electrode part including the pair of quadrilateral parts is not suitable for reducing the moving path of the carriers in the solar cell in which the electrodes of different polarities are positioned together on the back surface of the solar cell.

SUMMARY OF THE INVENTION

The present disclosure is to provide a solar cell having excellent efficiency by improving the structure of the electrode, and a solar cell panel having an excellent output including the same.

More specifically, it is to provide a solar cell having excellent efficiency by reducing a moving distance of carriers in a part where the moving distance of the carriers can be increased, and a solar cell panel having an excellent output including the same.

In particular, when a semiconductor substrate has an inclined part near an edge, it is to provide a solar cell having excellent efficiency by having an electrode structure that can reduce the moving distance of the carriers in a part adjacent to the inclined part, and a solar cell panel having an excellent output including the same.

A solar cell according to an embodiment of the present disclosure includes an electrode including a connection part connecting at least some of a plurality of outer finger parts on one side adjacent to an inclined part of a semiconductor substrate. Such a connection part can reduce the moving distance of the carriers. For example, the solar cell according to the present embodiment can include a semiconductor substrate having an inclined part, first and second conductivity type regions formed at or on the one surface of the semiconductor substrate, and a back contact electrode structure having first and second electrodes connected to them, respectively. In the back contact electrode structure, the effect of reducing the moving distance of the carriers by the connecting part can be doubled. At least one of the first and second electrodes described above can include a connection part, and can further include a finger part. Here, the finger part can include a plurality of inner finger parts extending in a first direction, and a plurality of outer finger parts extending in the first direction adjacent to an edge in a second direction intersecting the first direction.

The connection part can extend in a direction intersecting the plurality of outer finger parts.

The connection part can extend in parallel with the inclined part to connect end parts of the plurality of outer finger parts.

A width of the connection part can be equal to or less than a width of the outer finger part and a width of the inner finger part.

The inclined part can include first and second inclined parts respectively positioned on one side and other side in the first direction at the edge in the second direction. The first electrode can include a plurality of first finger parts including a plurality of first inner finger parts extending in the first direction and a plurality of first outer finger parts extending in the first direction adjacent to the edge, and a first connection part connecting at least some of the plurality of first outer finger parts on the one side adjacent to the first inclined part. The second electrode can include a plurality of second finger parts including a plurality of second inner finger parts extending in the first direction and a plurality of second outer finger parts extending in the first direction adjacent to the edge, and a second connection part connecting at least some of the plurality of second outer finger parts on the other side adjacent to the second inclined part.

The first finger part and the second finger part can be alternately positioned in the second direction. The first connection part can be positioned to be spaced apart from the second outer finger part in the first inclined part, and the second connection part can be positioned to be spaced apart from the first outer finger part in the second inclined part.

A distance between the first connection part and an end part of the second outer finger part can be equal to or greater than a width of the first connection part in the first inclined part, or a distance between the second connection part and an end part of the first outer finger part can be equal to or greater than a width of the second connection part in the second inclined part.

A distance between the first connection part and an end part of the second outer finger part can be equal to or greater than a distance between the first connection part and the first inclined part, or a distance between the second connection part and an end part of the first outer finger part can be equal to or greater than a distance between the second connection part and the second inclined part.

The semiconductor substrate can have a conductivity type that is the same as the second conductivity type region and that is opposite to the first conductivity type region, and a width of the second connection part can be equal to or less than a width of the first connection part.

A width of the second finger part can be equal to or less than a width of the first finger part.

The inclined part can include first and second inclined parts respectively positioned on one side and other side in the first direction at a first edge in the second direction, and third and fourth inclined parts respectively positioned on one side and other side in the first direction at a second edge opposite to the first edge in the second direction. The first electrode can include a plurality of first finger parts including a plurality of first inner finger parts extending in the first direction and a plurality of first outer finger parts extending in the first direction adjacent to the first and second edges, respectively, and a first connection part connecting at least some of the plurality of first outer finger parts on the one side adjacent to the first and third inclined parts, respectively. The second electrode can include a plurality of second finger parts including a plurality of second inner finger parts extending in the first direction and a plurality of second outer finger parts extending in the first direction adjacent to the first and second edges, respectively, and a second connection part connecting at least some of the plurality of second outer finger parts on the other side adjacent to the second and fourth inclined part, respectively.

A solar cell panel according to the present embodiment can include the above-described solar cell and a wiring member. Here, the wiring member can include a plurality of first wiring members connected to the first electrode of the solar cell and a plurality of second wiring members connected to the second electrode of the solar cell on the one surface of the solar cell.

At this time, the first and second wiring members can extend in the second direction and can be alternately positioned in the first direction, and at least one first wiring member and at least one second wiring member can be positioned in the inclined part, respectively. Here, the first wiring member can be positioned farther from the first inclined part than the second wiring member on one side of a first main part of a first edge positioned between the first inclined part and the second inclined part, and the second wiring member can be positioned farther from the second inclined part than the first wiring member on other side of the first main part of the first edge. In this structure, the moving distance of the carriers moving to the first and second wiring members positioned on the inclined part can be effectively reduced.

The first wiring member can extend outward from one side in the second direction, and an end part of the first wiring member positioned on other side in the second direction can be positioned to be spaced apart from the inclined part and the connection part inside the solar cell. The second wiring member can extend outward from the other side in the second direction, and an end part of the second wiring member positioned on the one side in the second direction can be positioned to be spaced apart from the inclined part and the connection part inside the solar cell.

The first finger part and the second finger part can be alternately positioned in the second direction, and the first and second wiring members can extend in the second direction and can be alternately positioned in the first direction. The solar cell panel can further include a connecting member positioned between the first electrode and the first wiring member and between the second electrode and the second wiring member, and can further include an insulating member positioned between the second electrode and the first wiring member and between the first electrode and the second wiring member.

Here, the insulating member can include an extended insulating member adjacent to the first or second connection part and a main insulating member having a shape or size different from that of the extended insulating member. For example, the extended insulating member can include a part in which a width in the first direction is less than or equal to half a width of the main insulating member. The extended insulating member can extend to cover the plurality of first or second outer finger part and the second or first outer finger part positioned therebetween in the second direction. As one example, the extended insulating member can be formed to cover the first or second connection part at a part where the first or second wiring member passes. The extended insulation member can improve structural stability, electrical stability, and the like in the structure having the first or second connection part.

According to the present embodiment, the moving path of the carriers can be reduced in the part adjacent to the inclined part by the connection part formed in the inclined part. As a result, the series resistance can be reduced and the faithful fidelity can be improved, and the efficiency of the solar cell can be improved. Here, since the connection part can be formed in the process of forming the electrode, the efficiency of the solar cell can be improved by a simple process without additional process.

In addition, the output loss (CTM loss) is effectively reduced in the solar cell panel where the wiring member is positioned in the inclined part, so that the output of the solar cell panel can be improved.

DETAILED DESCRIPTION OF THE EMBODIMENTS

Figure 1:
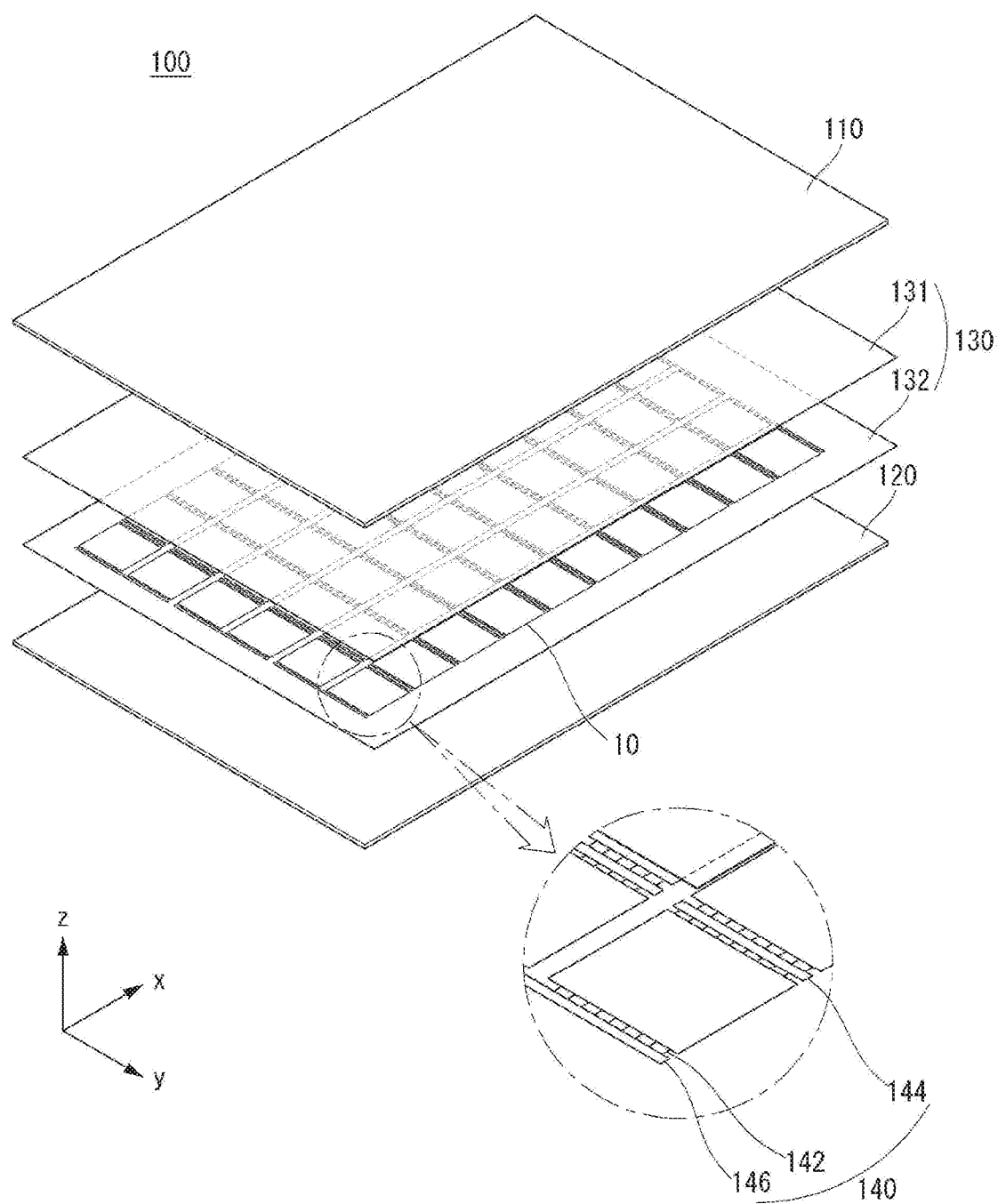
FIG. 1 is an exploded perspective view schematically showing a solar cell panel according to an embodiment of the present disclosure.

Hereinafter, embodiments of the present disclosure will be described in detail with reference to the accompanying drawings. However, it is needless to say that the present disclosure is not limited to these embodiments and can be modified into various forms.

In the drawings, illustration of the parts not related to the description is omitted in order to clarify and briefly describe the present disclosure, and the same reference numerals are used for the same or very similar parts throughout the specification. In the drawings, the thickness, width, and the like are enlarged or reduced to make the explanation more clear, and the thickness, width, etc. of the present disclosure are not limited to those shown in the drawings.

When a part is referred to as "including" another part throughout the specification, it does not exclude other parts and can further include other parts unless specifically stated otherwise. Further, when a part of a layer, a film, a region, a plate, or the like is referred to as being "on" other part, this includes not only the case where it is "directly on" the other part but also the case where the other part is positioned in the middle. When the part of the layer, the film, the region, the plate, or the like is referred to as being "directly on" the other part, it means that no other part is positioned in the middle.

Hereinafter, a solar cell and a solar cell panel including the solar cell according to an embodiment of the present disclosure will be described in detail with reference to the accompanying drawings.

Figure 2:
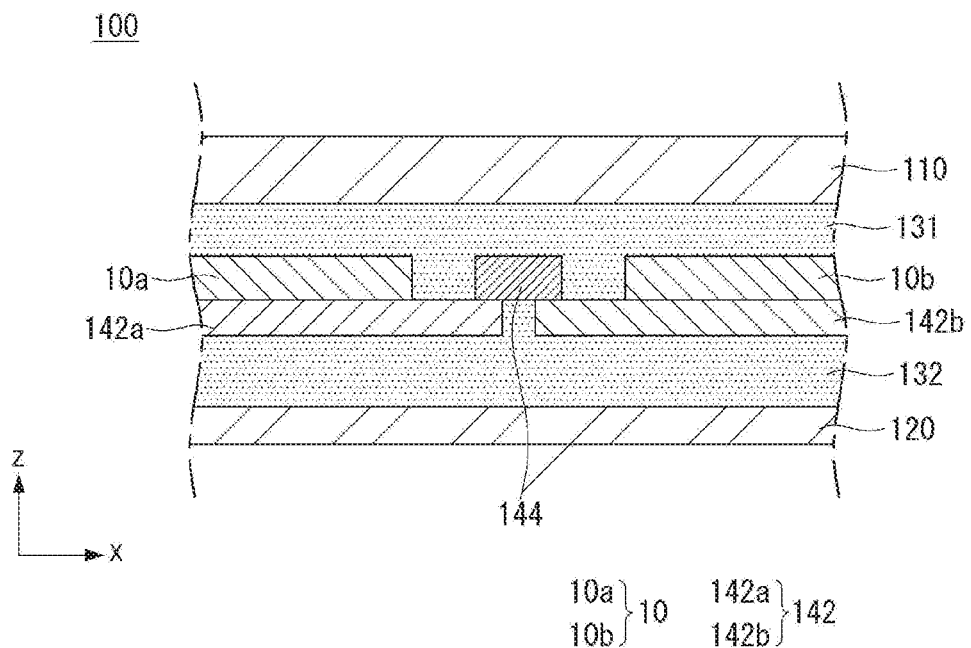
FIG. 2 is a partial cross-sectional view conceptually showing two solar cells included in a solar cell panel shown in FIG. 1 and a wiring unit connecting the two solar cells.

FIG. 1 is an exploded perspective view schematically showing a solar cell panel according to an embodiment of the present disclosure, and FIG. 2 is a partial cross-sectional view conceptually showing two solar cells included in a solar cell panel shown in FIG. 1 and a wiring unit connecting the two solar cells.

Referring to FIGS. 1 and 2, a solar cell panel 100 according to the present embodiment includes a solar cell 10 and a wiring unit 140 electrically connected to the solar cell 10. The solar cell panel 100 includes a sealing member 130 that encloses and seals the solar cell 10 and the wiring unit 140, a first cover member 110 positioned on one surface (e.g. a front surface) of the solar cell 10 on the sealing member 130, and a second cover member 120 positioned on the other surface (e.g. a back surface) of the solar cell 10 on the sealing member 130. This will be described in more detail.

First, the solar cell 10 can include a semiconductor substrate (reference numeral 12 in FIG. 3, hereinafter the same) and first and second electrodes (reference numerals 42 and 44 in FIG. 3, hereinafter same) positioned on one surface (e.g. a back surface) of the semiconductor substrate 12. This will be described in detail later with reference to FIG. 3.

In the present embodiment, the solar panel 100 is provided with a plurality of solar cells 10, and the plurality of solar cells 10 can be electrically connected in series, parallel, or series-parallel by the wiring unit 140.

Specifically, the wiring unit 140 can include a wiring member 142 whose at least a part overlaps the first and second electrodes 42 and 44 of the solar cell 10 and is connected to the first and second electrodes 42 and 44, and a connecting wiring member 144 that is positioned between the solar cells 10 in a direction intersecting the wiring member 142 and connected to the wiring member 142. The plurality of solar cells 10 can be connected in one direction (the x-axis direction in the drawing) by the wiring member 142 and the connecting wiring member 144 to form one row (that is, a solar cell string). The wiring member 142 and the connecting wiring member 144 will be described in more detail later with reference to FIG. 4. The wiring unit 140 can further include a bus bar wiring member 146 positioned at both ends of the solar cell string and connecting the same to another solar cell string or a junction box (not shown).

The wiring member 142, the connecting wiring member 144, and the bus bar wiring member 146 each can include a conductive material (e.g. a metal material). For example, the wiring member 142, the connecting wiring member 144, or the bus bar wiring member 146 can include a conductive core including any one of gold (Au), silver (Ag), copper (Cu), or aluminum (Al), and a conductive coating layer including tin (Sn) or an alloy including tin, positioned on the surface of the conductive core. For example, the core can be formed of copper, and the conductive coating layer can be formed of SnBiAg which is an alloy containing tin. However, the present disclosure is not limited thereto, and the material, shape, connection structure, etc. of the wiring member 142, the connecting wiring member 144, or the bus bar wiring member 146 can be variously modified. In addition, neighboring solar cells 10 can be connected by only the wiring member 142 without providing the connecting wiring member 144.

The sealing member 130 can include a first sealing member 131 positioned on the front surface of the solar cell 10 connected by the wiring member 142, and a second sealing member 132 positioned on the back surface of the solar cell 10. The first sealing member 131 and the second sealing member 132 prevent moisture and oxygen from entering and chemically bind each element of the solar cell panel 100. The first and second sealing members 131 and 132 can be made of an insulating material having transparency and adhesiveness. For example, an ethylene-vinyl acetate copolymer resin (EVA), a polyvinyl butyral, a silicon resin, an ester-based resin, an olefin-based resin, or the like can be used for the first sealing member 131 and the second sealing member 132. The second cover member 120, the second sealing member 132, the solar cell 10, the wiring unit 140, the first sealing member 131, and the first cover member 110 can be integrated to form the solar cell panel 100 by a lamination process or the like using the first and second sealing members 131 and 132.

The first cover member 110 is positioned on the first sealing member 131 to constitute the front surface of the solar cell panel 100, and the second cover member 120 is positioned on the second sealing member 132 to constitute the back surface of the solar cell panel 100. The first cover member 110 and the second cover member 120 each can be made of an insulating material capable of protecting the solar cell 10 from external shock, moisture, ultraviolet rays, or the like. The first cover member 110 can be made of a light transmitting material capable of transmitting light, and the second cover member 120 can be made of a sheet composed of a light transmitting material, a non-light transmitting material, or a reflective material, etc. For example, the first cover member 110 can be formed of a glass substrate or the like, and the second cover member 120 can be formed of a film, a sheet or the like. The second cover member 120 can have a TPT (Tedlar/PET/Tedlar) type, or include a polyvinylidene fluoride (PVDF) resin layer formed on at least one surface of a base film (for example, polyethylene terephthalate (PET)).

However, the present disclosure is not limited thereto. Accordingly, the first and second sealing members 131 and 132, the first cover member 110, or the second cover member 120 can include various materials other than those described above, and can have various shapes. For example, the first cover member 110 or the second cover member 120 can have various shapes (for example, a substrate, a film, a sheet, etc.) or materials.

Figure 3:
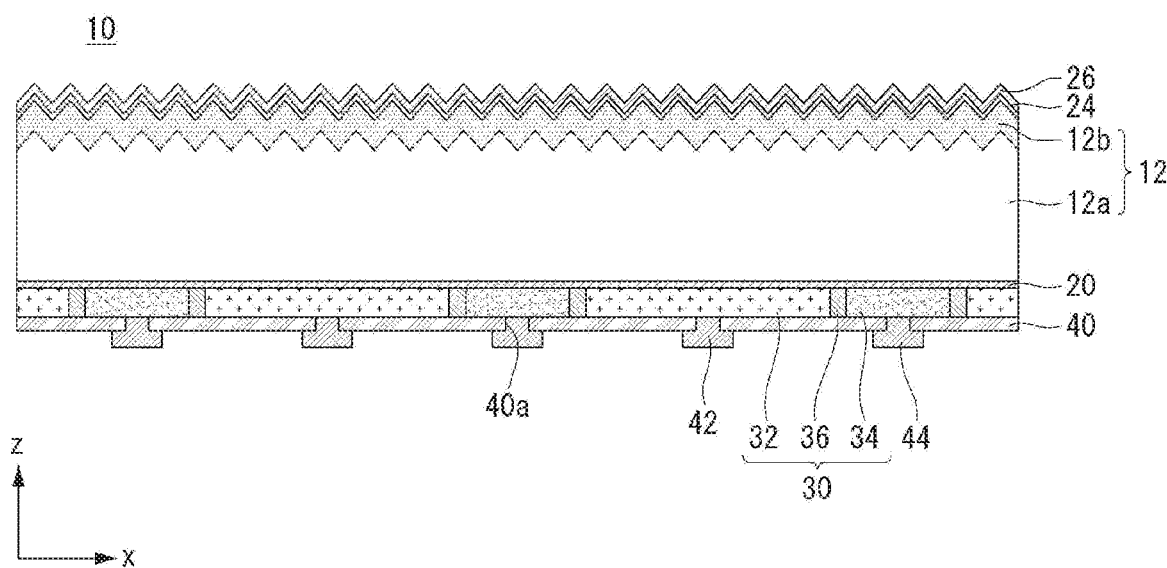
FIG. 3 is a cross-sectional view illustrating an example of a solar cell included in a solar cell panel shown in FIG. 1.

An example of the solar cell 10 included in the solar cell panel 100 according to an embodiment of the present disclosure will be described in more detail with reference to FIG. 3. FIG. 3 is a cross-sectional view illustrating an example of the solar cell 10 included in the solar cell panel 100 shown in FIG. 1.

Referring to FIG. 3, the solar cell 10 according to the present embodiment includes a semiconductor substrate 12 having an inclined part (reference numeral 14 in FIG. 4, hereinafter the same), first and second conductivity type regions 32 and 34 formed at or on one surface (e.g. the back surface) of the semiconductor substrate 12, first and second electrodes 42 and 44 connected to the first and second conductivity type regions 32 and 34 on the one surface of the semiconductor substrate, respectively. As described above, the solar cell 10 can have the first and second conductivity type regions 32 and 34 related to carriers of opposite polarities on the back surface of the semiconductor substrate 12, and a back electrode structure in which the first and second electrodes 42 and 44 are positioned together to be spaced apart from each other.

For example, the semiconductor substrate 12 can include a base region 12a formed of a crystalline semiconductor (for example, a single crystal or polycrystalline semiconductor, for example, a single crystal or polycrystalline silicon, in particular, the single crystal silicon) including a first or second conductivity type dopant. As described above, the solar cell 10 based on the base region 12a or the semiconductor substrate 12 having fewer defects due to high crystallinity has excellent electrical characteristics.

A front surface field region 12b can be positioned on the front surface of the semiconductor substrate 12. For example, the front surface field region 12b is a doped region having the same conductivity type as the base region 12a and having a higher doping concentration than the base region 12a, and can form a part of the semiconductor substrate 12. However, the present disclosure is not limited thereto. Accordingly, various modifications are possible such that the front surface field region 12b is a semiconductor layer positioned separately from the semiconductor substrate 12, or is formed of an oxide layer, etc. having a fixed charge or the like not including a dopant.

In addition, the front surface of the semiconductor substrate 12 can be provided with an anti-reflection structure (for example, a pyramid-shaped texturing structure has a (111) plane of the semiconductor substrate 12) to prevent reflection, thereby minimizing reflection. In addition, the back surface of the semiconductor substrate 12 can be formed of a mirror polished surface to have a surface roughness smaller than the front surface, thereby improving passivation characteristics. However, the present disclosure is not limited thereto and various modifications are possible.

An interlayer 20 can be positioned between the semiconductor substrate 12 and the conductivity type regions 32 and 34 on the back surface of the semiconductor substrate 12. The interlayer 20 can be entirely positioned (e.g. contacted) on the back surface of the semiconductor substrate 12.

The interlayer 20 can serve as a passivation layer for passivating the surface of the semiconductor substrate 12. Alternatively, the interlayer 20 can serve as a dopant control or a diffusion barrier to prevent dopants in the conductivity type regions 32 and 34 from excessively diffusing into the semiconductor substrate 12. The interlayer 20 can include various materials capable of performing the above-described role. For example, the interlayer 20 can formed of an oxide layer, a dielectric layer or an insulating layer containing silicon, a nitride oxide layer, a carbon oxide layer, an intrinsic amorphous silicon layer, or the like. For example, when the conductivity type regions 32 and 34 are made of a polycrystalline semiconductor, the interlayer 20 can be easily manufactured and can be a silicon oxide layer that enables smooth carrier transfer. As another example, when the conductivity type regions 32 and 34 are made of an amorphous semiconductor, the interlayer 20 can be made of the intrinsic amorphous silicon film.

A thickness of the interlayer 20 can be smaller than those of a front passivation layer 24, an anti-reflection layer 26 and a back passivation layer 40. For example, the thickness of the interlayer 20 can be 10 nm or less (e.g. 5 nm or less, more specifically, 2 nm or less, for example, 0.5 nm to 2 nm). This is to fully realize the effect of the interlayer 20, but the present disclosure is not limited thereto.

A semiconductor layer 30 including the conductivity type regions 32 and 34 can be positioned (e.g. contacted) on the interlayer 20. More specifically, the first conductivity type region 32 and the second conductivity type region 34 can be positioned together in the semiconductor layer 30 continuously formed on the interlayer 20, and can be positioned on the same plane. In addition, a barrier region 36 can be positioned on the same plane between the first conductivity type region 32 and the second conductivity type region 34.

The first and second conductivity type regions 32 and 34, and the barrier region 36, or the semiconductor layer 30 can have a crystal structure different from that of the semiconductor substrate 12. For example, the first and second conductivity type regions 32 and 34, and the barrier region 36, or the semiconductor layer 30 can include an amorphous semiconductor, a microcrystalline semiconductor, a polycrystalline semiconductor (e.g. amorphous silicon, microcrystalline silicon, or polycrystalline silicon), or the like, and the first conductivity type region 32 can include the first conductivity type dopant, and the second conductivity type region 34 can include the second conductivity type dopant. The barrier region 36 can be formed of an intrinsic or undoped semiconductor that is not doped with the first and second conductivity type dopants. At this time, when the first and second conductivity type regions 32 and 34, and the barrier region 36, or the semiconductor layer 30 have a polycrystalline semiconductor, they can have a high carrier mobility. At this time, when the first and second conductivity type regions 32 and 34, and the barrier region 36, or the semiconductor layer 30 have an amorphous semiconductor, they can be formed by a simple process.

At this time, when the base region 12*a* has the second conductivity type, the first conductivity type region 32 having a different conductivity type from the base region 12*a* functions as an emitter region, and the second conductivity type region 34 having the same conductivity type as the base region 12*a* functions as a back surface field region. The barrier region 36 can physically separate the first conductivity type region 32 and the second conductivity type region 34 to prevent a shunt that can occur when they contact each other.

At this time, an area (e.g. a width) of the first conductivity type region 32 can be larger than an area (e.g. a width) of the second conductivity type region 34. Accordingly, the first conductivity type region 32 serving as the emitter region has a larger area than the second conductivity type region 34 serving as the back surface field region, which can be advantageous for photoelectric conversion.

As described above, the first and second conductivity type regions 32 and 34 are formed of a separate layer different from the semiconductor substrate 12 with the interlayer 20 interposed therebetween. As a result, the carrier loss due to recombination can be minimized as compared with the case where the doped region formed by doping the dopant in the semiconductor substrate 12. The barrier region 36 can be formed of an intrinsic or undoped semiconductor to simplify the process of forming the barrier region 36.

However, the present disclosure is not limited thereto. Therefore, the interlayer 20 may not be provided. Alternatively, at least one of the first and second conductivity type regions 32 and 34 can be formed as a doped region in which a dopant is doped in the semiconductor substrate 12. The barrier region 36 may not be provided, or the barrier region 36 can include a material other than the semiconductor material. Many other variations are possible.

Here, when the first or second conductivity type dopant is p-type, group 3 elements such as boron (B), aluminum (Al), gallium (Ga), and indium (In) can be used. When the first or second conductivity type dopant is n-type, group 5 elements such as phosphorus (P), arsenic (As), bismuth (Bi), and antimony (Sb) can be used. For example, one of the first and second conductivity type dopants can be boron (B) and the other can be phosphorus (P).

The front passivation layer 24 and the anti-reflection layer 26 can be positioned (e.g. contacted) on the front surface of the semiconductor substrate 12, and the back passivation layer 40 including a contact hole 40*a* can be positioned (e.g. contacted) on the conductivity type regions 32 and 34 or the semiconductor layer 30. The front passivation layer 24 and the anti-reflection layer 26 can be entirely formed on the front surface of the semiconductor substrate 12, and the back passivation layer 40 can be entirely formed on the semiconductor layer 30 except for the contact hole 40*a*. For example, the front passivation layer 24, the anti-reflection layer 26, or the back passivation layer 40 may not include a dopant to have excellent insulation characteristics, passivation characteristics, and the like.

For example, the front passivation layer 24, the anti-reflection layer 26, or the back passivation layer 40 can formed of one or a multi-layered structure in which two or more layers are combined selected from a silicon nitride layer, a silicon nitride layer containing hydrogen, a silicon oxide layer, a silicon oxynitride layer, an aluminum oxide layer, silicon carbide layer, $MgF_2$, ZnS, $TiO_2$ and $CeO_2$.

In addition, the first electrode 42 can be electrically connected (e.g. contacted) to the first conductivity type region 32 through the contact hole 40*a*, and the second electrode 44 can be electrically connected (e.g. contacted) to the second conductivity type region 34 through the contact hole 40*a*. The first electrode 42 and the second electrode 44 can be made of a conductive material (e.g. metal).

For example, in the present embodiment, the first and second electrodes 42 and 44 can include copper and tin, and first and second finger parts 42*a* and 44*a* formed by extending in a first direction, as described above. 100 or more of the first and second finger parts 42*a* and 44*a* can be positioned on the one surface of the semiconductor substrate 12. As a result, the moving distance of the carriers can be reduced, so that the carriers can be collected and transmitted stably. Here, a thicknesses of the first and second finger parts 42*a* and 44*a* can be 10 μm or more. However, the present disclosure is not limited thereto.

Such a solar cell 10 is electrically connected to another solar cell 10 by the wiring unit 140 including the wiring member 142. The wiring member 142 or the wiring unit 140 includes a conductive material (e.g. metal) to be connected to outside or to the solar cell 10. Hereinafter, the structure of the solar cell 10 and the wiring unit 140 will be described in more detail with reference to FIG. 4.

Figure 4:
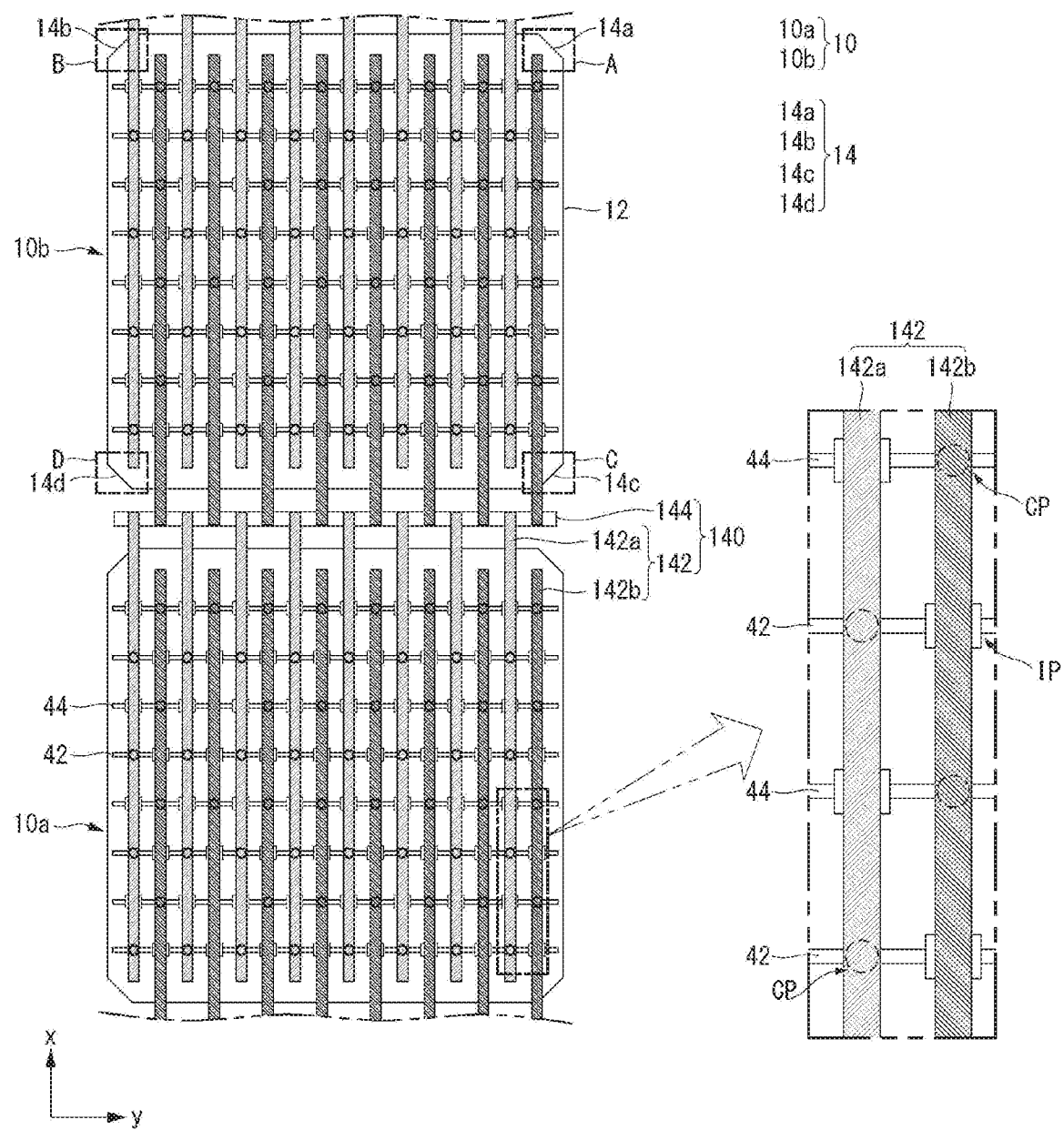
FIG. 4 is a back plan view schematically illustrating two solar cells adjacent to each other and included in a solar cell panel shown in FIG. 1, a wiring member, a connecting wiring member, an insulating member, and a connecting member.

FIG. 4 is a back plan view schematically illustrating two solar cells 10 adjacent to each other and included in a solar cell panel 100 shown in FIG. 1, a wiring member 142, a connecting wiring member 144, an insulating member IP, and a connecting member CP. FIG. 4 is a drawing for explaining a connection structure between the electrodes 42 and 44 and the wiring member 140 of the solar cell 10. In FIG. 4, the electrodes 42 and 44 are schematically illustrated. Accordingly, the present embodiment is not limited to the number, shape, and the like of the electrodes 42 and 44 and the wiring member 142 shown in FIG. 4, and specific structures, arrangements, and the like of the electrodes 42 and 44, the insulating member IP, the connecting member CP, and the wiring member 142 according to the present embodiment will be described in more detail later with reference to FIGS. 5 and 6. For clarity, the two solar cells 10 adjacent to each other are referred to as a first solar cell 10*a* and a second solar cell 10*b*.

The solar cell 10 is electrically connected to the wiring unit 140 including the wiring member 142 to enable electrical connection with another solar cell 10 or an external circuit. At this time, in the present embodiment, the connecting member CP is positioned between the electrodes 42 and 44 and the wiring unit 140 at a part that should be connected to each other among a plurality of overlapping parts where the electrodes 42 and 44 and the wiring unit 140 overlap with each other, and the insulating member IP is positioned between the electrodes 42 and 44 and the wiring unit 140 at part that should not be connected to each other among a plurality of overlapping parts where the electrodes 42 and 44 and the wiring unit 140 overlap with each other.

The first electrode 42 of the first solar cell 10*a* and the second electrode 44 of the second solar cell 10*b* adjacent thereto can be connected by a plurality of wiring members 142 and the connecting wiring member 144.

In the present embodiment, the electrodes 42 and 44 include a plurality of first and second electrodes 42 and 44 extending in a first direction (y-axis direction in the drawing) and alternately positioned in a second direction (x-axis direction in the drawing) intersecting the second direction. The wiring member 142 can include a first wiring member 142a extending in the second direction and electrically connected to the first electrode 42 and a second wiring member 142b extending in the second direction and electrically connected to the second electrode 44. A plurality of first wiring members 142a can be provided, and a plurality of second wiring members 142b can be provided, and the first wiring members 142a and the second wiring members 142b can be alternately positioned in the first direction. Then, the plurality of first and second wiring members 142a and 142b can be connected to the first and second electrodes 42 and 44 at uniform intervals to effectively transfer the carriers.

At this time, the first wiring member 142a is electrically connected to the first electrode 42 provided in each solar cell 10 through the connecting member CP, and the second wiring member 142b is electrically connected to the second electrode 44 provided in each solar cell 10 through the connecting member CP. In addition, the first wiring member 142a and the second electrode 44 can be insulated from each other by the insulating member IP, and the second wiring member 142b and the first electrode 42 can be insulated from each other by the insulating member IP.

The connecting member CP can include an adhesive material having various conductivity. For example, the connecting member CP can be formed of a material including a material included in the first and second electrodes 42 and 44 and/or the wiring member 142 or a mixture thereof. For example, the connecting member CP can include materials of the first and second electrodes 42 and 44 and/or the wiring member 142, for example, by a process of placing the wiring member 142 on the first or second electrodes 42 and 44 and applying heat. Alternatively, the connecting member CP can include a solder paste including tin or an alloy including the same, or an epoxy solder paste in which tin or an alloy including the same is included in the epoxy resin. As described above, the connecting member CP includes an adhesive material for physically fixing or bonding the electrodes 42 and 44 and the wiring member 142, such as solder or epoxy. As a result, the connecting member CP can electrically and physically fix the electrodes 42 and 44 and the wiring member 142. For example, the connecting member CP can be in contact with the electrodes 42 and 44 and the wiring member 142 to physically and electrically connect the electrodes 42 and 44 to the wiring member 142.

The insulating member IP can be positioned between the first wiring member 142a and the second electrode 44, which should not be at least electrically connected to each other, to electrically insulate them. Similarly, the insulating member IP can be positioned between the second wiring member 142b and the first electrode 42, which should not be at least electrically connected to each other, to electrically insulate them. The insulating member IP can include various insulating materials. For example, the insulating member IP can include silicone resin, epoxy resin, urethane resin, acrylic resin, polyimide, polyethylene, or the like.

Hereinafter, the structure of the electrodes 42 and 44, the structure of the insulating member IP and the connecting member CP, the arrangement of the wiring member 142, and the like according to the present embodiment will be described in detail with reference to FIGS. 4 to 6.

Figure 5:
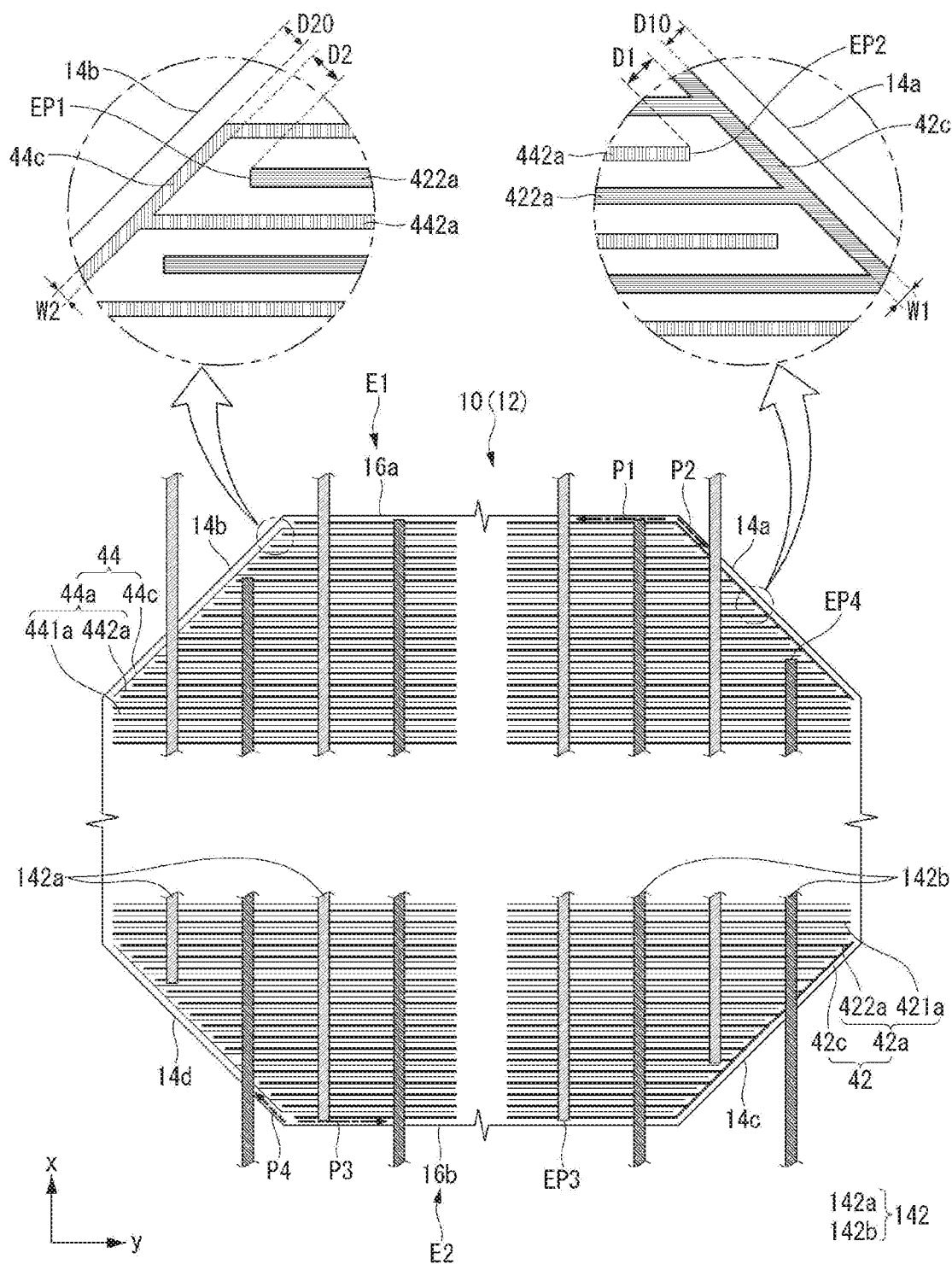
FIG. 5 is an enlarged plan view of a semiconductor substrate, electrodes, and a wiring member of parts A to D of FIG. 4.
Figure 6:
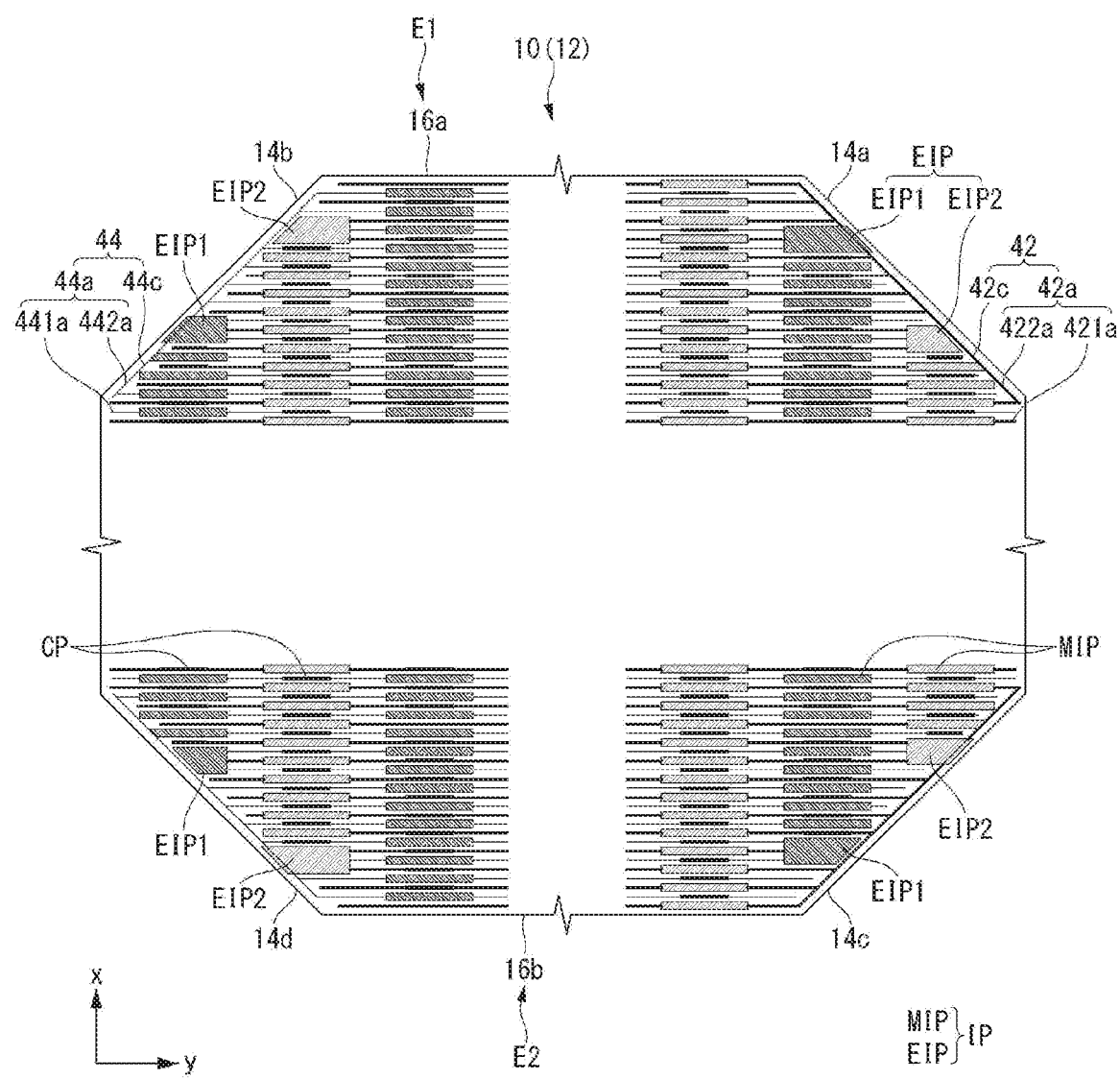
FIG. 6 is an enlarged plan view of a semiconductor substrate, electrodes, an insulating member, and a connecting member of parts A to D of FIG. 4.

FIG. 5 is an enlarged plan view of a semiconductor substrate 12, electrodes 42 and 44, and a wiring member 142 of parts A to D of FIG. 4, and FIG. 6 is an enlarged plan view of a semiconductor substrate 12, electrodes 42 and 44, an insulating member IP, and a connecting member CP of parts A to D of FIG. 4. For simplicity, the insulating member IP and the connecting member CP are not shown in FIG. 5.

Referring to FIGS. 4 to 6, in the present embodiment, the semiconductor substrate 12 includes an inclined part 14 or a chamfer near a corner. More specifically, the inclined part 14 at or adjacent a first edge E1 (an upper edge in FIG. 5) in the second direction can include a first inclined part 14a positioned on one side (a right side in FIG. 5) in the first direction and a second inclined part 14b positioned on the other side (a left side in FIG. 5) in the first direction. The inclined part 14 at or adjacent a second edge E2 (a lower edge in FIG. 5) opposite to the first edge E1 in the second direction can include a third inclined part 14c positioned on one side in the first direction and a fourth inclined part 14d positioned on the other side in the first direction. A first main part 16a is positioned between the first inclined part 14a and the second inclined part 14b in the second direction at the first edge E1. A second main part 16b is positioned between the third inclined part 14c and the fourth inclined part 14d in the first direction at the second edge E2. The first and second inclined parts 14a and 14b are separated from one another in the y-axis direction (or the first direction), and the third and fourth inclined parts 14c and 14d are separated from one another also in the y-axis direction. Meanwhile, the first and third inclined parts 14a and 14c are separated from one another in the x-axis direction (or the second direction) and the second and fourth inclined parts 14b and 14d are separated from one another also in the x-axis direction. Each of the first, second, third and fourth inclined parts 14a, 14b, 14c and 14d can extend in a direction intersecting the x-axis or y-axis directions.

As described above, the first and second wiring members 142a and 142b extend in the second direction and are alternately positioned in the first direction, and in the present embodiment, at least one first wiring member 142a and at least one second wiring member 142b can be positioned in each inclined part 14 (that is, each of the first inclined part 14a, the second inclined part 14b, the third inclined part 14c, and the fourth inclined part 14d). As described above, when the first and second wiring members 142a and 142b are provided in large numbers, the first and second wiring members 142a and 142b are also positioned in each inclined part 14. Since the electrodes 42 and 44 are formed to have a shorter length than the other portions by the inclined portion 14, a part of the electrodes 42 and 44 can increase the moving distance of the carrier. In the present embodiment, it is possible to prevent this by improving the structure of the electrodes 42 and 44 in the inclined part 14. In embodiments, the first and second wiring members 142a and 142b can be interdigitated.

Specifically, in the present embodiment, the first electrode 42 can include a plurality of first finger parts 42a and a first connection part 42c. More specifically, the plurality of first finger parts 42a can include a plurality of first inner finger parts 421a extending in the first direction, and a plurality of first outer finger parts 422a extending in parallel in the first direction adjacent to the edges E1 and E2 in the second direction. The first connection part 42c can connect at least some of the plurality of first outer finger parts 422a at a part adjacent to the inclined part 14.

The first electrode 42 can include the plurality of first outer finger parts 422a positioned between the first inclined part 14a and the second inclined part 14b adjacent to the first edge E1, the plurality of first outer finger parts 422a positioned between the third inclined part 14c and the fourth inclined part 14d adjacent to the second edge E2, and the plurality of first inner finger parts 421a positioned between the first outer finger parts 422a adjacent to the first and second edges E1 and E2, respectively. The first connection part 42c can connect at least some of the plurality of first outer finger parts 422a on one side adjacent to the first inclined part 14a, and another first connection part 42c can connect at least some of the plurality of first outer finger parts 422a on one side adjacent to the third inclined part 14c. In embodiments, the plurality of first inner finger parts 421a can have the same length with each other, and the plurality of second inner finger parts 441a can have the same length with each other. In embodiments, the plurality of first inner finger parts 421a and the plurality of second inner finger parts 441a can have the same length with each other, but such is not required. In embodiments, the plurality of first outer finger parts 422a can have different lengths from each other, and the plurality of second outer finger parts 442a can have different lengths from each other. Lengths of the plurality of first outer finger parts 422a and the plurality of second outer finger parts 442a corresponds to how close or far is each from the first and second edges E1 and E2, respectively.

The first connection part 42c can extend in a direction intersecting the plurality of first outer finger parts 422a. More specifically, the first connection part 42c can extend in parallel with the inclined part 14 to connect at least some end parts of the plurality of first outer finger parts 422a positioned adjacent thereto. For example, in the present embodiment, the first connection part 42c can extend in parallel with the first inclined part 14a to connect at least some end parts of the plurality of first outer finger parts 422a positioned adjacent thereto, and another first connection part 42c can extend in parallel with the third inclined part 14c to connect at least some end parts of the plurality of first outer finger parts 422a positioned adjacent thereto.

Similarly, the second electrode 44 can include a plurality of second finger parts 44a and a second connection part 44c. Here, in the second direction, the first finger part 42a and the second finger part 44a can be alternately positioned one by one. The plurality of second finger parts 44a can include a plurality of second inner finger parts 441a extending in the first direction, and a plurality of second outer finger parts 442a extending in parallel in the first direction adjacent to the edges E1 and E2 in the second direction. The second connection part 44c can connect at least some of the plurality of second outer finger parts 442a at a part adjacent to the inclined part 14.

For example, the second electrode 44 can include the plurality of second outer finger parts 442a alternately positioned with the first outer finger part 422a between the first inclined part 14a and the second inclined part 14b adjacent to the first edge E1, the plurality of second outer finger parts 442a alternately positioned with the first outer finger part 422a between the third inclined part 14c and the fourth inclined part 14d adjacent to the second edge E2, and the plurality of second inner finger parts 441a positioned between the second outer finger parts 442a adjacent to the first and second edges E1 and E2, respectively. The second connection part 44c can connect at least some of the plurality of second outer finger parts 442a on the other side adjacent to the second inclined part 14b, and another second connection part 44c can connect at least some of the plurality of second outer finger parts 442a on the other side adjacent to the fourth inclined part 14d.

The second connection part 44c can extend in a direction intersecting the plurality of second outer finger parts 442a. More specifically, the second connection part 44c can extend in parallel with the inclined part 14 to connect at least some end parts of the plurality of second outer finger parts 442a positioned adjacent thereto. For example, in the present embodiment, the second connection part 44c can extend in parallel with the second inclined part 14b to connect at least some end parts of the plurality of second outer finger parts 442a positioned adjacent thereto, and another second connection part 44c can extend in parallel with the fourth inclined part 14d to connect at least some end parts of the plurality of second outer finger parts 442a positioned adjacent thereto.

In the present embodiment, the connection parts 42c and 44c reduce the moving path of the carriers in the vicinity of the inclined part 14, thereby reducing the series resistance. As a result, the fill factor (FF) and efficiency of the solar cell 10 can be improved.

More specifically, when viewed from on one side (the right side in the drawing) of the first and second main parts 16a and 16b adjacent to the first and third inclined parts 14a and 14c, the first wiring member 142a is positioned farther than the second wiring member 142b from the first and third inclined parts 14a and 14c. That is, when viewed from the first direction, the second wiring member 142b is positioned closest to the first and third inclined parts 14a and 14c, and then the first wiring member 142a is positioned on one side of the first and second main parts 16a and 16b.

At this time, unlike the present embodiment, if the first connection part 42c is not provided, first carriers generated near the first and third inclined parts 14a and 14c adjacent to the first and second edges E1 and E2 may not be moved to the first wiring member 142a positioned in the first and third inclined parts 14a and 14c. Accordingly, as shown by a first path P1 of FIG. 5, since the first carriers must move to the first wiring member 142a positioned on the one side of the first and second main parts 16a and 16b, the first carriers have a long moving path. On the other hand, if the first connection part 42c is provided in the first and third inclined parts 14a and 14c, as shown by a second path P2 of FIG. 5, the first carriers generated near the first and third inclined parts 14a and 14c adjacent to the first and second edges E1 and E2 can move to the first wiring member 142a positioned in the first and third inclined parts 14a and 14c through the first connection part 42c. As a result, the second path P2 can more reduce the moving path of the first carriers than the first path P1.

When viewed from on the other side (the left side in the drawing) of the first and second main parts 16a and 16b adjacent to the second and fourth inclined parts 14b and 14d, the second wiring member 142b is positioned farther than the first wiring member 142a from the second and fourth inclined parts 14b and 14d. That is, when viewed from the first direction, the first wiring member 142a is positioned closest to the second and fourth inclined parts 14b and 14d, and then the second wiring member 142b is positioned on the other side of the first and second main parts 16a and 16b.

At this time, unlike the present embodiment, if the second connection part 44c is not provided, second carriers generated near the second and fourth inclined parts 14b and 14d adjacent to the first and second edges E1 and E2 may not be moved to the second wiring member 142b positioned in the second and fourth inclined parts 14b and 14d. Accordingly, as shown by a third path P3 of FIG. 5, since the second carriers must move to the second wiring member 142b positioned on the other side of the first and second main parts 16a and 16b, the second carriers have a long moving path. On the other hand, if the second connection part 44c is provided in the second and fourth inclined parts 14b and 14d, as shown by a fourth path P4 of FIG. 5, the second carriers generated near the second and fourth inclined parts 14b and 14d adjacent to the first and second edges E1 and E2 can move to the second wiring member 142b positioned in the second and fourth inclined parts 14b and 14d through the second connection part 44c. As a result, the fourth path P4 can more reduce the moving path of the second carriers than the third path P3.

As such, when the first and second wiring members 142a and 142b related to different polarities are positioned on both sides of the first and second main parts 16a and 16b, the first and second connection parts 42c and 44c are formed on the both sides, respectively, to effectively reduce the moving paths of the first and second carriers. However, the present disclosure is not limited thereto. Accordingly, the same first or second wiring members 142a and 142b can be positioned on the both sides of the first and second main parts 16a and 16b. Even in this case, when the first and second connection parts 42c and 44c are formed on the both sides, there is a part that can reduce the moving distance of the first or second carriers in some area of the inclined part 14. In addition, the structure, arrangement, and the like of the first and second connection parts 42c and 44c can be variously modified by the arrangement of the first and second wiring members 142a and 142b. In addition, the first and second connection parts 42c and 44c can be positioned to be spaced apart from each other in each inclined part 14 in consideration of the moving paths of the first and second carriers at apart adjacent to each inclined part 14. This will be described in more detail later with reference to FIG. 10.

Here, the first connection part 42c can be positioned to be spaced apart from the second outer finger part 442a in the inclined part 14, and the second connection part 44c can be positioned to be spaced apart from the first outer finger part 422a in the inclined part 14. For example, the first connection part 42c can be positioned to be spaced apart from an end part EP2 of the second outer finger part 442a in each of the first and third inclined parts 14a and 14c, and the second connection part 44c can be positioned to be spaced apart from an end part EP1 of the first outer finger part 422a in each of the second and fourth inclined parts 14b and 14d. That is, the end part EP2 of the second outer finger part 442a can be positioned to be spaced apart from the first connection part 42c in the first and third inclined parts 14a and 14c where the first connection part 42c is positioned, and the end part EP1 of the first outer finger part 422a can be positioned to be spaced apart from the second connection part 44c in the second and fourth inclined parts 14b and 14d where the second connection part 44c is positioned. This can prevent problems such as unwanted shunts.

For example, a first distance D1 between the first connection part 42c and the end part EP2 of the second outer finger part 442a can be equal to or greater than a first width W1 of the first connection part 42c in the first inclined part 14a and/or the third inclined part 14c. A second distance D2 between the second connection part 44c and the end part EP1 of the first outer finger part 422a can be equal to or greater than a second width W2 of the second connection part 44c in the second inclined part 14b and/or the fourth inclined part 14d. Here, the first distance D1 and the second distance D2 can mean the shortest distance. The first width W1 and the second width W2 can be line widths (e.g. maximum line widths) of the first or second connection parts 42c and 44c in a direction orthogonal to an extending direction of the first or second connection parts 42c and 44c. This can effectively prevent problems such as unwanted shunts. In particular, when the first distance D1 is greater than the first width W1 and the second distance D2 is greater than the second width W2, the problems such as unwanted shunts can be more effectively prevented.

The first distance D1 can be equal to or greater than a first outer distance D10 between the first connection part 42c and the first inclined part 14a, and the second distance D2 can be equal to or greater than a second outer distance D20 between the second connection part 44c and the second inclined part 14b. Here, the first outer distance D10 and the second outer distance D20 can mean the shortest distance. This can effectively prevent problems such as unwanted shunts. In particular, when the first distance D1 is greater than the first outer distance D10 and the second distance D2 is greater than the second outer distance D20, the problems such as unwanted shunts can be more effectively prevented.

In the present embodiment, the first width W1 of the connection part 42c can be equal to or less than a width of the first outer finger part 422a and a width of the first inner finger part 421a in the second direction, respectively. For example, the first width W1 of the first connection part 42c can be less than the width of the first outer finger part 422a and the width of the first inner finger part 421a in the second direction, respectively. The second width W2 of the second connection part 44c can be equal to or less than a width of the second outer finger part 442a and a width of the second inner finger part 441a in the second direction, respectively. For example, the second width W2 of the second connection part 44c can be less than the width of the second outer finger part 442a and the width of the second inner finger part 441a in the second direction, respectively. When the first width W1 and the second width W2 are relatively large, this is because the first connecting portion 42c and/or the second connecting portion 44c are adjacent to the inclined portion 14, so that problems such as undesired defects and characteristic changes can occur.

As described above, since a width of the second conductivity type region 34 can be less than a width of the first conductivity type region 32, a width of the second electrode 44 connected thereto can be equal to or less than a width of the first electrode 42. More specifically, the width of the second connection part 44c can be equal to or less than the width of the first connection part 42c, and a width of the second finger part 44a can be equal to or less than a width of the first finger part 42a. For example, the width of the second connection part 44c can be less than the width of the first connection part 42c, and the width of the second finger part 44a can be less than the width of the first finger part 42a. As a result, the first and second electrodes 42 and 44 can be formed in consideration of the widths of the first and second conductivity type regions 32 and 34, thereby preventing problems such as defects due to tolerances that can occur during the manufacturing process.

As described above, the first finger part 42a and the second finger part 44a are alternately positioned in the second direction, and the first and second wiring members 142a and 142b extend in the second direction and are alternately positioned in the first direction. At this time, the first wiring member 142a can extend outward from one side (an upper side in the drawing) in the second direction, and an end part EP3 of the first wiring member 142a can be positioned on other side (a lower side in the drawing) in the second direction. At this time, the end part EP3 of the first wiring member 142a can be positioned to be spaced apart from the inclined part 14 and the connection parts 42c and 44c inside each solar cell 10. The second wiring member 142b can extend outward from the other side (the lower side in the drawing) in the second direction, and an end part EP4 of the second wiring member 142b can be positioned on the one side in the second direction. At this time, the end part EP4 of the second wiring member 142*b* can be positioned to be spaced apart from the inclined part 14 and the connection parts 42*c* and 44*c* inside each solar cell 10. Then, it is possible to effectively prevent the shapes of the connection parts 42*c* and 44*c* having relatively thin widths from changing in the end parts EP3 and EP4 of the first and second wiring members 142*a* and 142*b* are positioned or the undesired shunt in the inclined part 14.

For example, in the first inclined part 14*a*, the first wiring member 142*a* can extend outward, and the end part EP4 of the second wiring member 142*b* can be positioned to be spaced apart from the first inclined part 14*a* and the first connection part 42*c* inside the solar cell 10. In the second inclined part 14*b*, the first wiring member 142*a* can extend outward, and the end part EP4 of the second wiring member 142*b* can be positioned to be spaced apart from the second inclined part 14*b* and the second connection part 44*c* inside the solar cell 10. In the third inclined part 14*c*, the second wiring member 142*b* can extend outward, and the end part EP3 of the first wiring member 142*a* can be positioned to be spaced apart from the third inclined part 14*c* and the first connection portion 42*c* inside the solar cell 10. In the fourth inclined part 14*d*, the second wiring member 142*b* can extend outward, and the end part EP3 of the first wiring member 142*a* can be positioned to be spaced apart from the fourth inclined part 14*d* and the second connection part 44*c* inside the solar cell 10.

As described above, the connecting member CP can be provided between the first electrode 42 and the first wiring member 142*a* and between the second electrode 44 and the second wiring member 142*b*, and the insulating member IP can be provided between the second electrode 44 and the first wiring member 142*a* and between the first electrode 42 and the second wiring member 142*b*.

However, problems can occur such that the first or second wiring members 142*a* and 142*b* are undesirably connected to the connection parts 42*c* and 44*c* or the outer finger parts 422*a* and 442*a* at a part where the first or second wiring members 142*a*, 142*b* passes at a part adjacent to the inclined part 14 or the connection parts 42*c* and 44*c*. In order to prevent this, the shape of the insulating member IP and the arrangement of the insulating member IP and the connecting member CP can be different from the other parts in the parts adjacent to the inclined part 14 or the connection parts 42*c* and 44*c*.

A main insulating member MIP and the connecting member CP, which are positioned at parts not adjacent to the inclined part 14 or the connection parts 42*c* and 44*c*, are positioned at parts corresponding to the first or second wiring members 142*a* and 142*b* in the first direction and are alternately positioned one by one in the second direction. The main insulating member MIP can have a size or shape different from that of an extended insulating member EIP. The connecting member CP positioned on the first electrode 42 (more specifically, the first finger part 42*a*) and the main insulating member MIP positioned on the second electrode 44 can be alternately positioned in the second direction in the part where the first wiring member 142*a* is positioned. The connecting member CP positioned on the second electrode 44 (more specifically, the second finger part 44*a*) and the main insulating member MIP positioned on the first electrode 42 can be alternately positioned in the second direction in the part where the second wiring member 142*b* is positioned. When viewed from the first direction, the connecting member CP corresponding to the first wiring member 142*a* and the main insulating member MIP corresponding to the second wiring member 142*b* can be alternately positioned on the first electrode 42, and the connecting member CP corresponding to the second wiring member 142*b* and the main insulating member MIP corresponding to the first wiring member 142*a* can be alternately positioned on the second electrode 44. Here, for excellent insulation characteristics, a width of the main insulating member MIP can be greater than a width of the connecting member CP and a width of the first or second wiring members 142*a* and 142*b* in the first direction. When applying pressure to attach the first or second wiring members 142*a* and 142*b*, it is considered that the first or second wiring members 142*a* and 142*b* can be pushed to both sides in the first direction.

Present embodiment can further include an extended insulating member EIP. The extended insulating member can formed where the first or second wirings 142*a* and 142*b* are passed adjacent to the inclined portion 14 or the connecting portions 42*c* and 44*c*, or the end of the first or second wirings 142*a* and 142*b* are disposed. The extended insulating member EIP insulates between the plurality of outer finger portions 422*a* and 442*a* and the first or second wirings 142*a* and 142*b*. For example, a first extended insulating member EIP1 can be positioned to cover the plurality of second outer finger parts 442*a* that should not be connected to the first wiring member 142*a* and at least one first outer finger part 422*a* positioned therebetween at a part where the first wiring member 142*a* passes while adjacent to the first inclined part 14*a* and the first connection part 42*c* formed therein. A second extended insulating member EIP2 can be positioned to cover the plurality of first outer finger parts 422*a* that should not be connected to the second wiring member 142*b* and at least one second outer finger part 442*a* positioned therebetween at a part where the end part EP4 of the second wiring member 142*b* is positioned while adjacent to the first inclined part 14*a* and the first connection part 42*c* formed therein.

The first extended insulating member EIP1 can be positioned to cover the plurality of second outer finger parts 442*a* that should not be connected to the first wiring member 142*a* and at least one first outer finger part 422*a* positioned therebetween at a part where the first wiring member 142*a* passes while adjacent to the second inclined part 14*b* and the second connection part 44*c* formed therein. The second extended insulating member EIP2 can be positioned to cover the plurality of first outer finger parts 422*a* that should not be connected to the second wiring member 142*b* and at least one second outer finger part 442*a* positioned therebetween at a part where the end part EP4 of the second wiring member 142*b* is positioned while adjacent to the second inclined part 14*b* and the second connection part 44*c* formed therein.

At this time, the first extended insulating member EIP1 related to the first wiring member 142*a* extending outward in the first and second inclined parts 14*a* and 14*b* can be positioned to cover the first or second connection parts 42*c* and 44*c*. As a result, it is possible to effectively prevent a problem such as a shunt due to the shape change of the first or second connection parts 42*c* and 44*c* at the part where the first wiring member 142*a* is positioned. The second extended insulating member EIP2 related to the second wiring member 142*b* at which the end part EP4 is positioned on the first and second inclined parts 14*a* and 14*b* can be is positioned to be spaced apart from the first or second connection parts 42*c* and 44*c*. As a result, the material cost of the second extended insulating member EIP2 can be reduced. However, the present disclosure is not limited thereto. Therefore, the first and second extended insulating members EIP1 and EIP2 can be positioned to cover the first or second connection parts 42c and 44c, or not to cover the first or second connection parts 42c and 44c.

The first extended insulating member EIP1 can be positioned to cover the plurality of second outer finger parts 442a that should not be connected to the first wiring member 142a and at least one first outer finger part 422a positioned therebetween at a part where the end part EP3 of the first wiring member 142a is positioned while adjacent to the third inclined part 14c and the first connection part 42c formed therein. The second extended insulating member EIP2 can be positioned to cover the plurality of first outer finger parts 422a that should not be connected to the second wiring member 142b and at least one second outer finger part 442a positioned therebetween at a part where the second wiring member 142b passes while adjacent to the third inclined part 14c and the first connection part 42c formed therein.

The first extended insulating member EIP1 can be positioned to cover the plurality of second outer finger parts 442a that should not be connected to the first wiring member 142a and at least one first outer finger part 422a positioned therebetween at a part where the end part EP3 of the first wiring member 142a is positioned while adjacent to the fourth inclined part 14d and the second connection part 44c formed therein. The second extended insulating member EIP2 can be positioned to cover the plurality of first outer finger parts 422a that should not be connected to the second wiring member 142b and at least one second outer finger part 442a positioned therebetween at a part where the second wiring member 142b passes while adjacent to the fourth inclined part 14d and the second connection part 44c formed therein.

At this time, the second extended insulating member EIP2 related to the second wiring member 142b extending outward from the third and fourth inclined parts 14c and 14d can be positioned to cover the first or second connection parts 42c and 44c. As a result, it is possible to effectively prevent a problem such as a shunt due to the shape change of the first or second connection parts 42c and 44c at the part where the second wiring member 142b is positioned. The first extended insulating member EIP1 related to the first wiring member 142a at which the end part is positioned on the third and fourth inclined parts 14c and 14d can be is positioned to be spaced apart from the first or second connection parts 42c and 44c. As a result, the material cost of the first extended insulating member EIP1 can be reduced. However, the present disclosure is not limited thereto. Therefore, the first and second extended insulating members EIP1 and EIP2 can be positioned to cover the first or second connection parts 42c and 44c, or not to cover the first or second connection parts 42c and 44c.

As described above, since the extended insulating member EIP is positioned adjacent to the connection parts 42c and 44c, the width of the extended insulating member EIP in the first direction can include a part that is less than half the width of the main insulating member MIP. The connecting member CP or the main insulating member MIP can have an approximately-rectangular shape extending in the first direction. The extended insulating member EIP can have a right trapezoidal shape including at least one first side having a width less than half of the width of the main insulating member MIP, a second side opposite and parallel to the first side, a third side connecting vertically one ends of the first and second sides opposite to the inclined part in the first direction to the first and second sides, and a fourth side connecting the other ends of the first and second sides adjacent to the inclined part in the first direction in parallel with the inclined part. For example, the extended insulating member EIP can include a part (that is, at least a part adjacent to the first side) having a width less than that of the connecting member CP in the first direction, and have a length greater than that of the connecting member CP in the second direction.

In the above description, it is illustrated that the first connection part 42c is positioned on the first and third inclined parts 14a and 14c, respectively, and the second connection part 44c is positioned on the second and fourth inclined parts 14b and 14d, respectively. However, the present disclosure is not limited thereto.

For example, the first connection part 42c can be positioned in one of the first and third inclined parts 14a and 14c, and the second connection part 44c can be positioned in the other. Alternatively, the first connection part 42c can be positioned in one of the second and fourth inclined parts 14b and 14d, and the second connection part 44c can be positioned in the other. Even in this case, there is a part that can reduce the moving distance of the first or second carriers in some areas of the inclined par 14 by the first and second connection parts 42c and 44c positioned in each inclined part 14.

As another example, the first connection part 42c can be positioned in any one of the first and third inclined parts 14a and 14c, or the second connection part 44c can be positioned in any one of the second and fourth inclined parts 14b and 14d. For example, the first connection part 42c can be positioned in the first inclined part 14a positioned on one side where the first wiring member 142a extends outward in the first and third inclined parts 14a and 14c. The second connection part 44c can be positioned in the fourth inclined part 14d positioned on the other side where the second wiring member 142b extends outward in the second and fourth inclined parts 14b and 14d. As a result, the first or second wiring members 142a and 142b are positioned to pass through the first or second connection parts 42c and 44c, thereby effectively reducing the moving distance of the carriers. However, the present disclosure is not limited thereto. The first connection part 42c can be positioned in the third inclined part 14c in the first and third inclined parts 14a and 14c, and/or the second connection part 44c can be positioned in the second inclined part 14d in the second and fourth inclined parts 14b and 14d. Many other variations are possible.

In addition, in the present embodiment, it is illustrated that each of the first electrode 42 and the second electrode 44 includes the first and second connection parts 42c and 44c. However, the present disclosure is not limited thereto, and at least one of the first and second electrodes 42 and 44 can include the connection parts 42c and 44c.

As such, whether or not the connection parts 42c and 44c are formed, and the arrangement of the first and second connection parts 42c and 44c can be variously modified in each inclined part 14.

According to the present embodiment, it is possible to reduce the moving path of the carriers in the part adjacent to the inclined part 14 by the connection parts 42c and 44c formed in the inclined part 14. As a result, the series resistance can be reduced and the fill factor (FF) can be improved, and the efficiency of the solar cell 10 can be improved. Since the connection part 42c and 44c can be formed in a process of forming the electrodes 42 and 44, the efficiency of the solar cell 10 can be improved by a simple process without additional process. In addition, the output of the solar cell panel 100 can be improved by effectively reducing an output loss of the solar cell panel 100 including the solar cell 10 described above and the wiring member 142 positioned in the inclined part 14. Here, the output loss of the solar cell panel 100 can refer to cell to module loss (CTM loss) that can occur while modularizing a cell.

Hereinafter, a solar cell and a solar cell panel including the same according to other embodiments of the present disclosure will be described in detail. Parts that are the same or extremely similar to the above description will be omitted in detail and only different parts will be described in detail. The combinations of the above-described embodiment or modified embodiment thereof and the following embodiment or modified embodiments thereof are also within the scope of the present disclosure.

Figure 7:
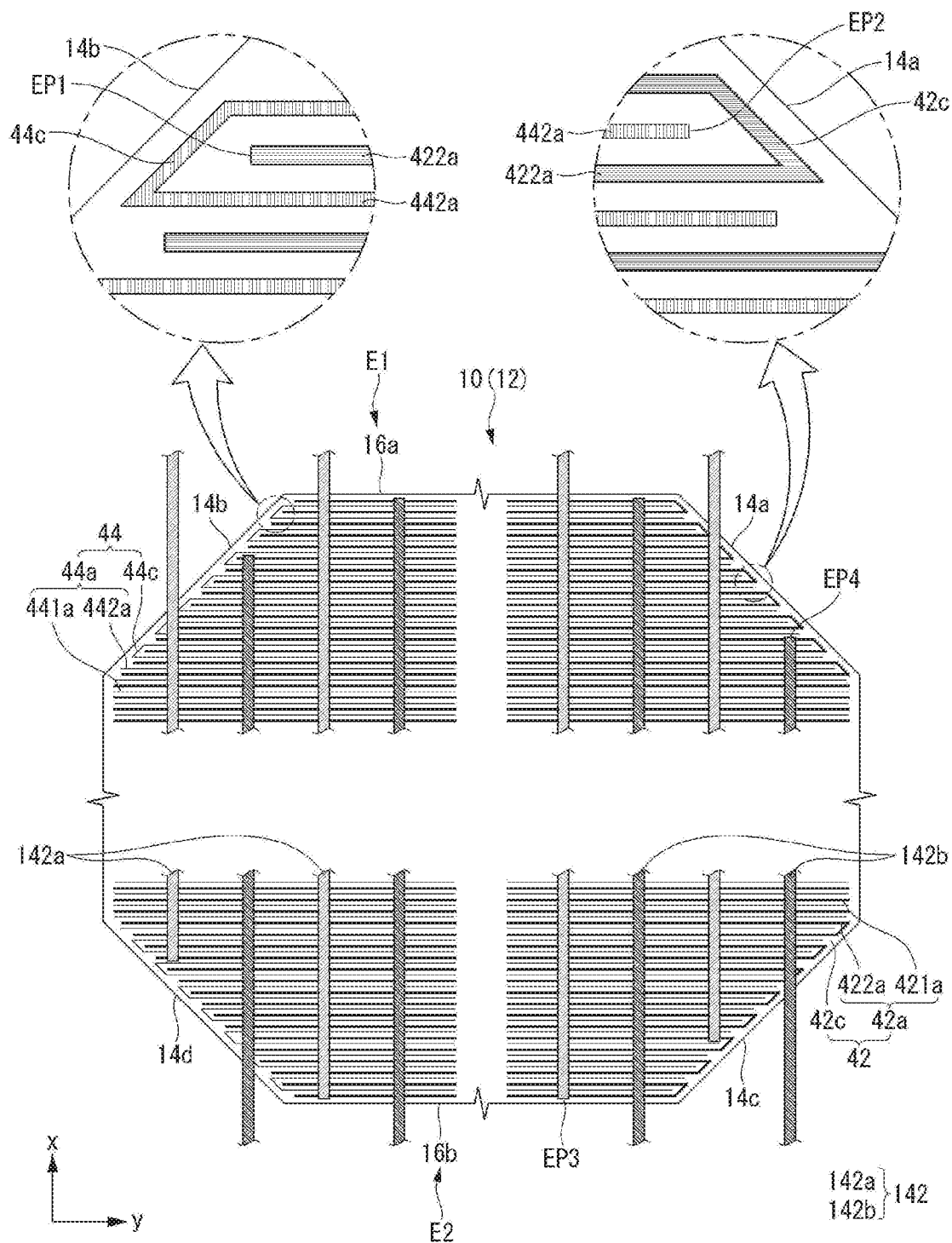
FIG. 7 is a plan view illustrating a solar cell and a wiring member included in a solar cell panel according to another embodiment of the present disclosure.

FIG. 7 is a plan view illustrating a solar cell and a wiring member included in a solar cell panel according to another embodiment of the present disclosure. FIG. 7 is an enlarged plan view of a semiconductor substrate, an electrode, and a wiring member in parts corresponding to parts A to D of FIG. 4, and for simplicity, an insulating member and a connecting member are not illustrated in FIG. 7.

In the above-described embodiment with reference to FIG. 5, the first and second connection parts 42c and 44c can connect the ends of the plurality of outer finger parts 422a and 442a as a whole to simplify the manufacturing process and to stably provide the moving path of the carriers. However, the present disclosure is not limited thereto, As shown in FIG. 7, first and second connection parts 42c and 44c do not entirely connect ends of a plurality of outer finger parts 422a and 442a, and can partially connect only a part of the plurality of outer finger parts 422a and 442a. In FIG. 7, for example, a plurality of first and second connection parts 42c and 44c are formed to connect two adjacent outer finger parts 422a and 442a to each other among the plurality of outer finger parts 422a and 442a, respectively, and the plurality of first and second connection parts 42c and 44c are positioned to be spaced apart from each other in each inclined part 14. Accordingly, a part where the end parts of the plurality of outer finger parts 422a and 442a are connected by the first and second connection parts 42c and 44c and a part where the end parts of the plurality of outer finger parts 422a and 442a are not connected by the first and second connection parts 42c and 44c can be alternately positioned in the inclined parts 14. Accordingly, it is possible to realize the effect of reducing the moving distance of the carriers while reducing the material cost by reducing the formation area of the first and second connection parts 42c and 44c.

FIG. 7 illustrates that the first and second connection parts 42c and 44c have the same or similar shape or arrangement to each other, but at least one of the first and second connection parts 42c and 44c can have the above-described shape or arrangement. In addition, it is illustrated that the first and second connection parts 42c and 44c connect two adjacent outer finger parts 422a and 442a and are positioned to be spaced apart from each other, however, the present disclosure is not limited thereto. The number of outer finger parts 422a and 442a connected by the first or second connection parts 42c and 44c, the number of outer finger parts 422a and 442a not connected by the first or second connecting parts 42c and 44c, and the number, arrangement, etc. of the first or second connection parts 42c and 44c in each inclined portion 14 can be variously modified.

Figure 8:
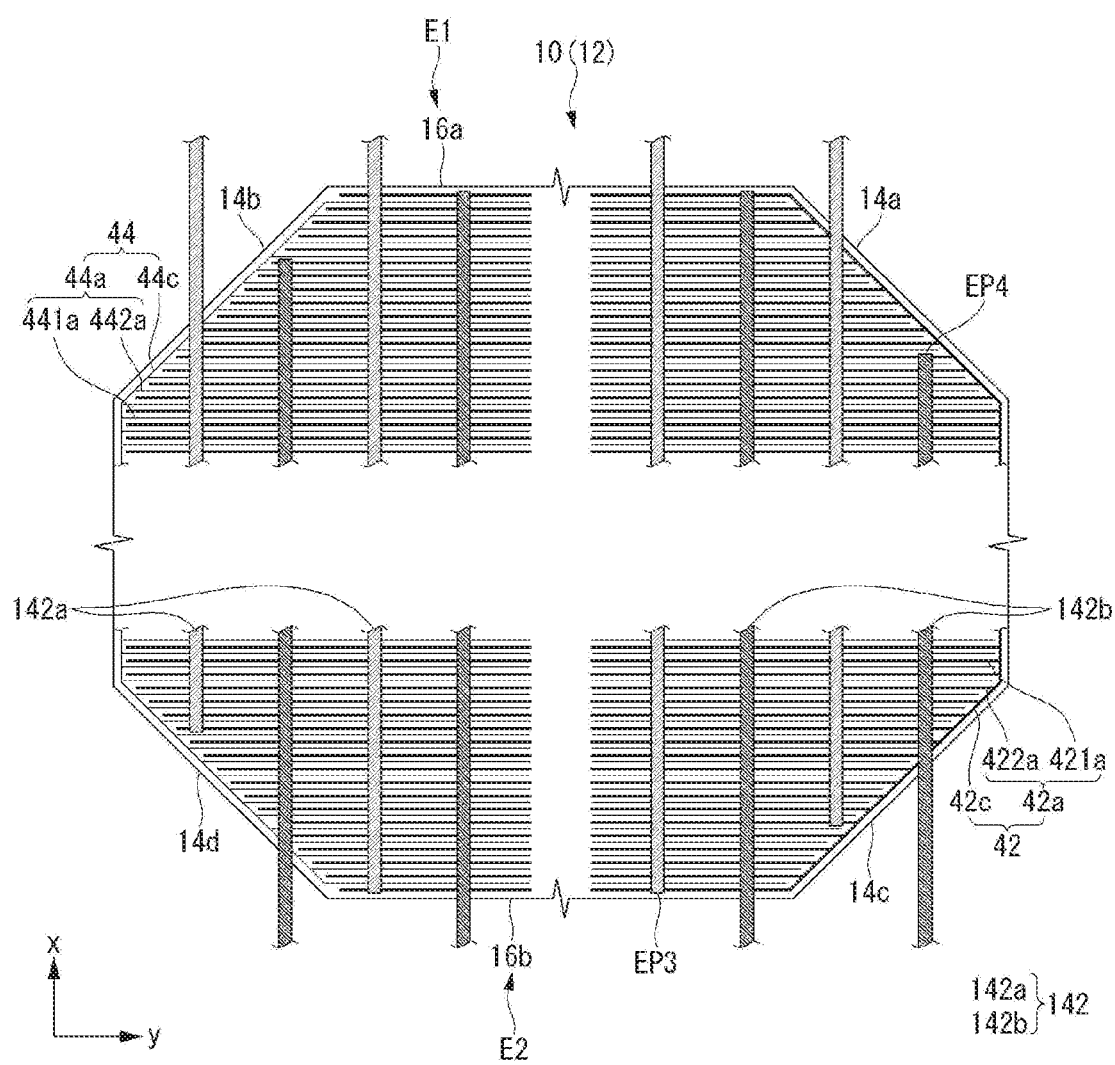
FIG. 8 is a plan view illustrating a solar cell and a wiring member included in a solar cell panel according to still another embodiment of the present disclosure.

FIG. 8 is a plan view illustrating a solar cell and a wiring member included in a solar cell panel according to still another embodiment of the present disclosure. FIG. 8 is an enlarged plan view of a semiconductor substrate, an electrode, and a wiring member in parts corresponding to parts A to D of FIG. 4, and for simplicity, an insulating member and a connecting member are not illustrated in FIG. 8.

As shown in FIG. 8, first and second connection parts 42c and 44c can connect end parts of a plurality of inner finger parts 421a and 441a as a whole together with end parts of a plurality of outer finger parts 422a and 442a. In FIG. 8, for example, the first connection part 42c is formed to connect a plurality of first outer finger parts 422a, a plurality of first inner finger parts 421a, and the plurality of first outer finger parts 422a as a whole on one side (the right side in the drawing) in the first direction, and the second connection part 44c is formed to connect a plurality of second outer finger parts 442a, a plurality of second inner finger parts 441a, and the plurality of second outer finger parts 442a as a whole on the other side (the left side in the drawing) in the first direction. According to this, the moving distance of the carriers can be effectively reduced while stably forming the first and second connection parts 42c and 44c.

FIG. 8 illustrates that the first and second connection parts 42c and 44c have the same or similar shape or arrangement to each other, but at least one of the first and second connection parts 42c and 44c can have the above-described shape or arrangement. In addition, the first or second connection parts 42c and 44c can have a structure for connecting only at least some of the plurality of outer finger parts 422a and 442a and the plurality of inner finger parts 421a and 441a. The number, arrangement, shape, etc. of the outer finger parts 422a and 442a or the inner finger parts 421a and 441a connected by the first or second connection parts 42c and 44c can be variously modified.

Figure 9:
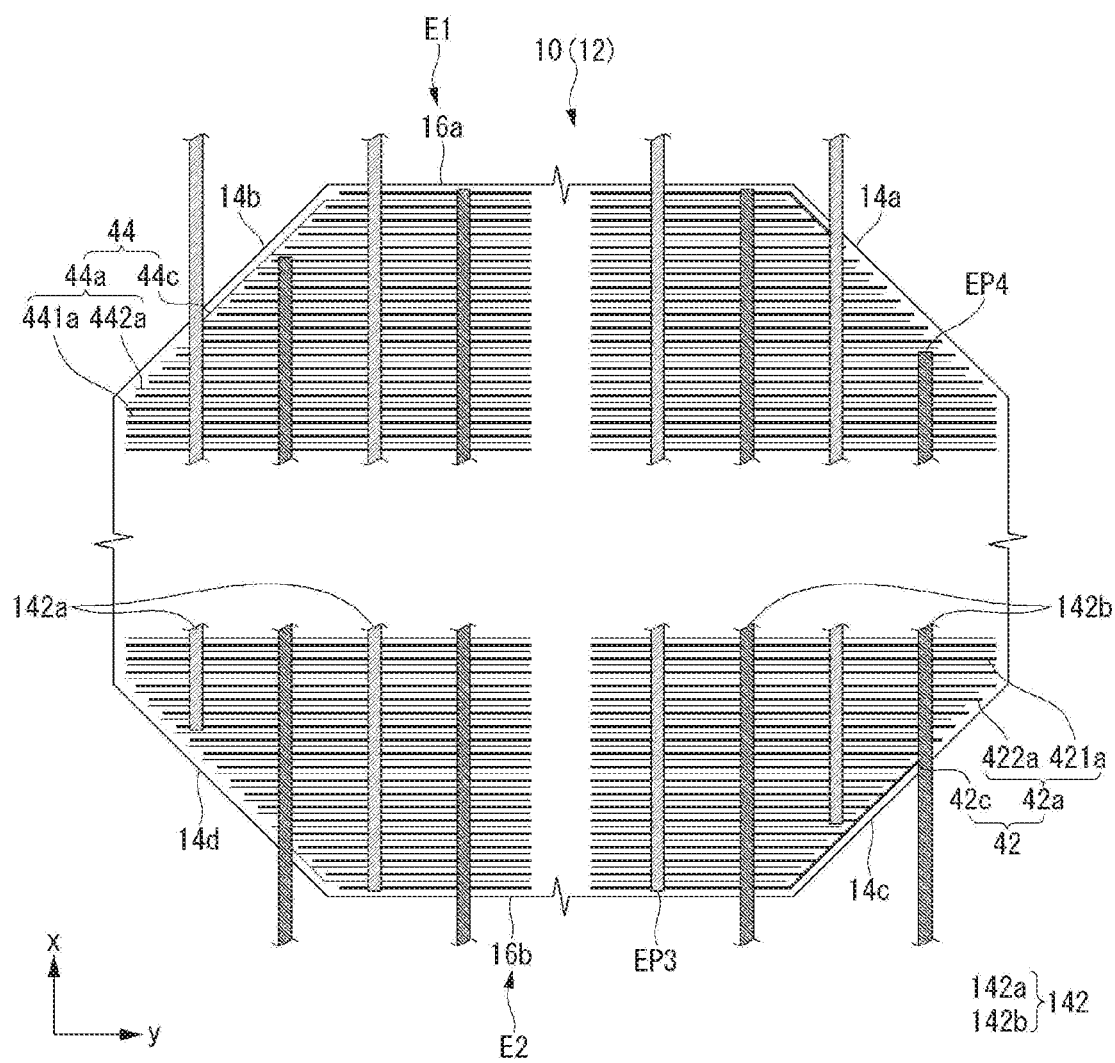
FIG. 9 is a plan view illustrating a solar cell and a wiring member included in a solar cell panel according to still another embodiment of the present disclosure.
Figure 10:
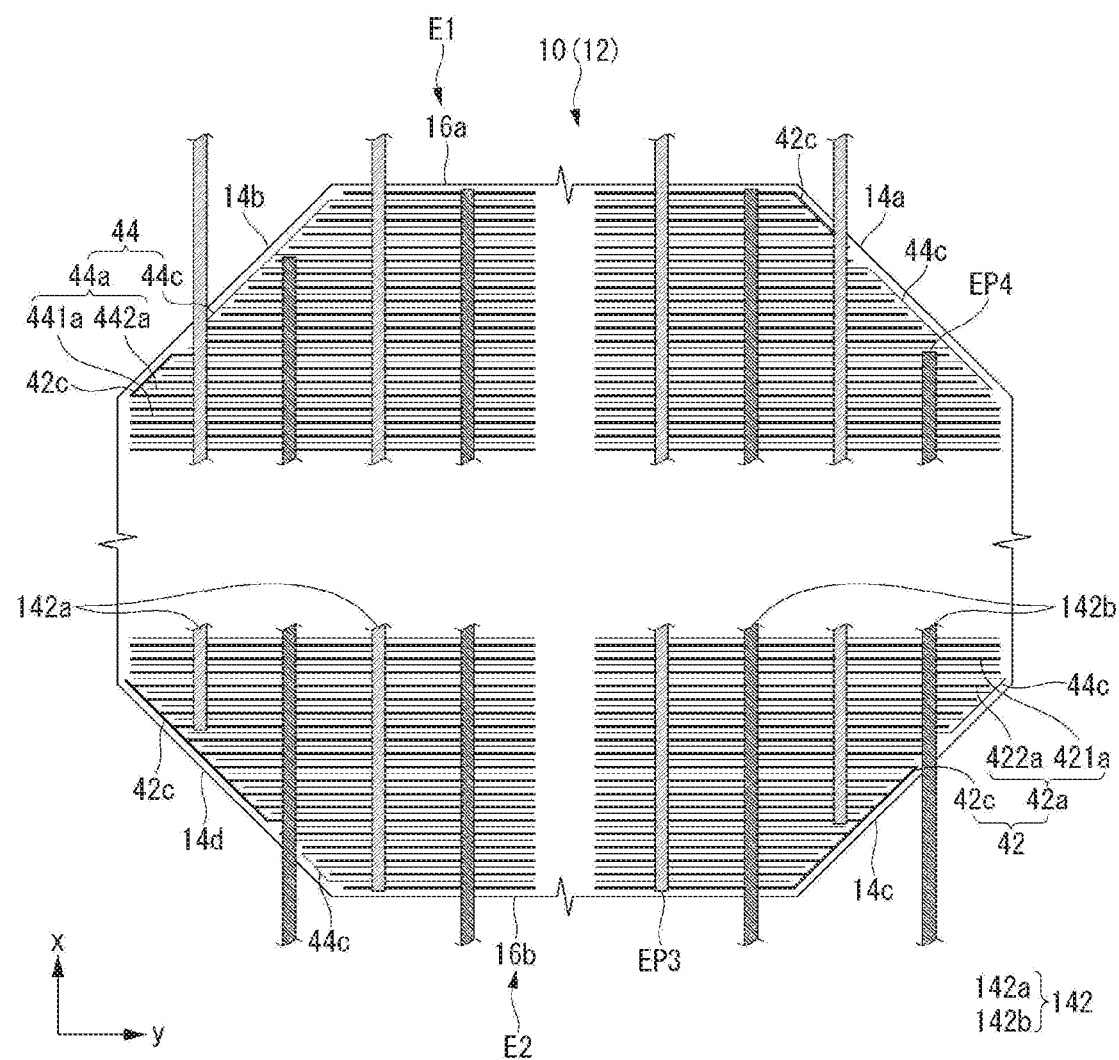
FIG. 10 is a plan view illustrating a solar cell and a wiring member included in a solar cell panel according to still another embodiment of the present disclosure.

FIGS. 9 and 10 are plan views illustrating a solar cell and a wiring member included in a solar cell panel according to still another embodiment of the present disclosure, respectively. FIGS. 9 and 10 are enlarged plan views of a semiconductor substrate, an electrode, and a wiring member in parts corresponding to parts A to D of FIG. 4, respectively, and for simplicity, an insulating member and a connecting member are not illustrated in FIGS. 9 and 10.

As shown in FIG. 9, at least one of first and second connection parts 42c and 44c can connect some of outer finger parts 422a and 442a in each inclined part 14. For example, when viewed in the first direction, the first and second connection parts 42c and 44c can be formed only inside wiring members 142a and 142b which are positioned on the outermost side among the first or second wiring members 142a and 142b extending outward. That is, in a part adjacent to the first edge E1 where the first wiring member 142a extends outward, the first connection part 42c can be positioned inside the first wiring member 142a in the first direction in the first inclined part 14a, and/or the second connection part 44c can be positioned inside the first wiring member 142a in the first direction in the second inclined part 14b. In a part adjacent to the second edge E2 where the second wiring member 142b extends outward, the first connection part 42c can be positioned inside the second wiring member 142b in the first direction in the third inclined part 14c, and/or the second connection part 44c can be positioned inside the second wiring member 142b in the first direction in the fourth inclined part 14d. Since the moving path of the first or second carriers to the first or second wiring member 142a or 142b in the corresponding part can be effectively reduced, the first or second connection parts 42c or 44c can be positioned only at a part that can greatly contribute to reducing the moving path of the carriers, thereby improving efficiency.

Alternatively, as shown in FIG. 10, first and second connection parts 42c and 44c can be positioned together in one inclined part 14. For example, in parts adjacent to each inclined part 14, when viewed in the first direction, the first or second connection parts 42c and 44c can be formed inside wiring members 142a and 142b which are positioned on the outermost side among the first or second wiring members 142a and 142b extending outward, and the second or first connection parts 44c and 42c can be formed outside wiring members 142a and 142b which are positioned on the outermost side among the first or second wiring members 142a and 142b extending outward. That is, in the first inclined part 14a of the first edge E1 where the first wiring member 142a extends outward, the first connection part 42c can be positioned inside the first wiring member 142a in the first direction, and the second connection part 44c can be positioned outside the first wiring member 142a in the first direction. In the second inclined part 14b of the first edge E1 where the first wiring member 142a extends outward, the second connection part 44c can be positioned inside the first wiring member 142a in the first direction, and the first connection part 42c can be positioned outside the first wiring member 142a in the first direction. Similarly, in the third inclined part 14c of the second edge E2 where the second wiring member 142b extends outward, the first connection part 42c can be positioned inside the second wiring member 142b in the first direction, and the second connection part 44c can be positioned outside the second wiring member 142b in the first direction. In the fourth inclined part 14d of the second edge E2 where the second wiring member 142b extends outward, the second connection part 44c can be positioned inside the second wiring member 142b in the first direction, and the first connection part 42c can be positioned outside the second wiring member 142b in the first direction. According to this, the moving paths of the first and second carriers in each inclined part 14 can be effectively reduced, thereby maximizing the effect. However, the present disclosure is not limited thereto, and the arrangement, shape, number, and the like of the first and second connection parts 42c and 44c can be variously modified in each inclination part 14.

Hereinafter, the present disclosure will be described in more detail with reference to manufacturing examples of the present disclosure. However, the manufacturing examples of the present disclosure to be described below are merely presented for illustration, and the present disclosure is not limited thereto.

MANUFACTURING EXAMPLE 1

An interlayer composed of a silicon oxide film is formed on one surface of an n-type single crystal semiconductor substrate. A semiconductor layer containing polycrystalline silicon is formed on a tunneling layer by low pressure chemical vapor deposition. Then, the semiconductor layer having a first conductivity type region and a second conductivity type region, respectively is formed by doping p-type dopants in some regions of the semiconductor layer and n-type dopants in other regions. A front passivation layer, an anti-reflection layer, and a back passivation layer are formed and a contact hole is formed. First and second electrodes electrically connected to the first conductivity type region and the second conductivity type region, respectively are formed through the contact hole. As shown in FIG. 4, the first and second electrodes include first and second connection parts on both sides of first and second edges.

First and second wiring members are connected in a direction intersecting an extending direction of the first and second electrodes by using a connecting member and an insulating member, and a solar cell panel is formed by laminating with a sealing member and a cover member.

COMPARATIVE EXAMPLE 1

A plurality of solar cells and a solar cell panel including the same are formed in the same manner as in Manufacturing Example 1 except that the first and second connection parts are not formed in the process of forming the first and second electrodes.

Figure 11:
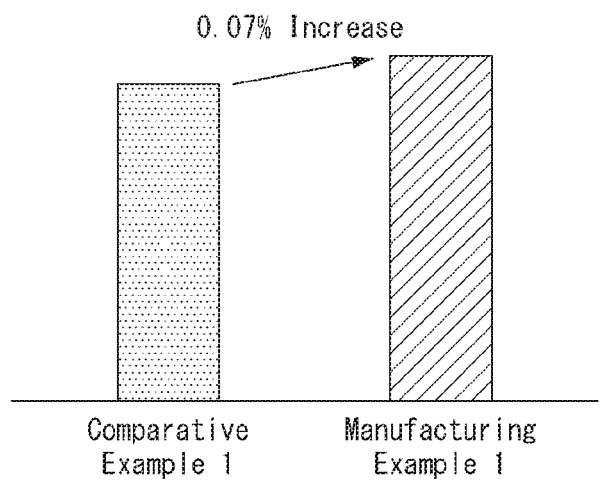
FIG. 11 is a graph showing results of measuring an average efficiency of a plurality of solar cells manufactured according to Manufacturing Example 1 and Comparative Example 1.
Figure 12:
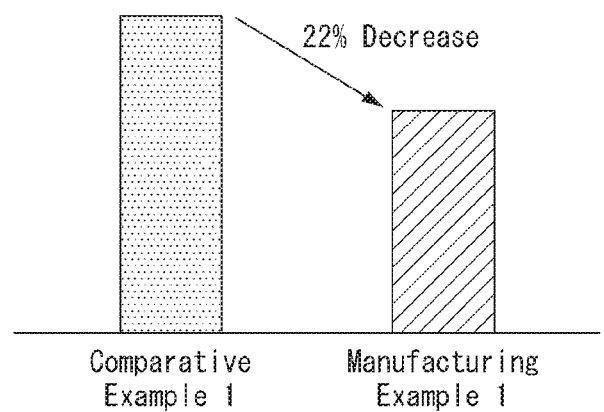
FIG. 12 is a graph showing results of measuring an average efficiency of a plurality of solar cells manufactured according to Manufacturing Example 1 and Comparative Example 1.

An average efficiency of the plurality of solar cells manufactured according to Manufacturing Example 1 and Comparative Example 1 and an output loss of the solar cell panel manufactured according to Manufacturing Example 1 and Comparative Example 1 are measured, respectively, and the results are shown in FIGS. 11 and 12.

Referring to FIG. 11, it can be seen that the solar cell according to Manufacturing Example 1 has a higher efficiency than the solar cell according to Comparative Example 1. More specifically, the solar cell according to Manufacturing Example 1 can have a higher efficiency by 0.07% than the solar cell according to Comparative Example 1. Referring to FIG. 12, it can be seen that the output loss is lower when the solar cell panel is manufactured using the solar cell according to Manufacturing Example 1 than when the solar cell panel is manufactured using the solar cell panel according to Comparative Example 1. More specifically, the solar cell panel according to Manufacturing Example 1 has a lower output loss by 22% than the solar cell panel according to Comparative Example 1. This is expected because the resistance is reduced without degrading other characteristics by reducing the moving distance of the carriers by the connection part.

The features, structures, effects and the like according to the above-described embodiments are included in at least one embodiment of the present disclosure, and are not necessarily limited to only one embodiment. Furthermore, the features, structures, effects, and the like illustrated in the embodiments can be combined or modified in other embodiments by those skilled in the art to which the embodiments belong. Accordingly, contents related to these combinations and modifications should be construed as being included in the scope of the present disclosure.

What is claimed is:

1. A solar cell, comprising:
   a semiconductor substrate having an inclined part;
   first and second conductivity type regions formed at or on one surface of the semiconductor substrate;
   a first electrode connected to the first conductivity type region at or on the one surface of the semiconductor substrate; and
   a second electrode connected to the second conductivity type region having an opposite polarity from a polarity of the first conductivity type region at or on the one surface of the semiconductor substrate,
   wherein at least one of the first and second electrodes includes:
   a finger part including a plurality of inner finger parts extending in a first direction, and a plurality of outer finger parts extending in the first direction and adjacent to an edge of the semiconductor substrate, the plurality of inner finger parts and the plurality of outer finger parts being separated in a second direction intersecting the first direction; and
   a connection part connecting at least some of the plurality of outer finger parts on one side of the semiconductor substrate adjacent to the inclined part, wherein the inclined part includes first and second inclined parts respectively positioned on one side and other side in the first direction at the edge of the semiconductor substrate in the second direction, wherein the first electrode includes a plurality of first finger parts including a plurality of first inner finger parts extending in the first direction and a plurality of first outer finger parts extending in the first direction adjacent to the edge, and a first connection part connecting the plurality of first outer finger parts on the one side adjacent to the first inclined part, wherein the second electrode includes a plurality of second finger parts including a plurality of second inner finger parts extending in the first direction and a plurality of second outer finger parts extending in the first direction adjacent to the edge, and a second connection part connecting the plurality of second outer finger parts on the other side adjacent to the second inclined part, wherein the plurality of first finger parts and the plurality of second finger parts are alternately positioned in the second direction, wherein the first connection part is positioned to be spaced apart from the plurality of second outer finger parts in the first inclined part and connects the plurality of first outer finger parts, and wherein the second connection part is positioned to be spaced apart from the plurality of first outer finger parts in the second inclined part and connects the plurality of second outer finger parts.

2. The solar cell of claim 1, wherein the connection part extends in a direction intersecting the plurality of outer finger parts.

3. The solar cell of claim 1, wherein the connection part extends in parallel with the inclined part to connect end parts of the plurality of outer finger parts.

4. The solar cell of claim 1, wherein a width of the connection part is equal to or less than a width of the plurality of outer finger parts and a width of the plurality of inner finger parts.

5. The solar cell of claim 1, wherein a distance between the first connection part and an end part of the plurality of second outer finger parts is equal to or greater than a width of the first connection part in the first inclined part, or a distance between the second connection part and an end part of the plurality of first outer finger parts is equal to or greater than a width of the second connection part in the second inclined part.

6. The solar cell of claim 1, wherein a distance between the first connection part and an end part of the plurality of second outer finger parts is equal to or greater than a distance between the first connection part and the first inclined part, or a distance between the second connection part and an end part of the plurality of first outer finger parts is equal to or greater than a distance between the second connection part and the second inclined part.

7. The solar cell of claim 1, wherein the semiconductor substrate has a conductivity type that is the same as the second conductivity type region and that is opposite to the first conductivity type region, and a width of the second connection part is equal to or less than a width of the first connection part.

8. The solar cell of claim 7, wherein a width of the plurality of second finger parts is equal to or less than a width of the plurality of first finger parts.

9. The solar cell of claim 1, wherein the inclined part includes third and fourth inclined parts respectively positioned on one side and other side in the first direction at a second edge of the semiconductor substrate opposite to the first edge in the second direction, wherein the first electrode includes the plurality of first finger parts including the plurality of first inner finger parts extending in the first direction and the plurality of first outer finger parts extending in the first direction adjacent to the first and second edges, respectively, and the first connection part connecting at least some of the plurality of first outer finger parts on the one side adjacent to the first and third inclined parts, respectively; and wherein the second electrode includes the plurality of second finger parts including the plurality of second inner finger parts extending in the first direction and the plurality of second outer finger parts extending in the first direction adjacent to the first and second edges, respectively, and the second connection part connecting at least some of the plurality of second outer finger parts on the other side adjacent to the second and fourth inclined parts, respectively.

10. The solar cell of claim 1, wherein the first connection part and the second connection part extend in a direction that intersects both the first direction and the second direction.

* * * * *